(12) United States Patent
Kaiser et al.

(10) Patent No.: US 7,230,265 B2
(45) Date of Patent: Jun. 12, 2007

(54) SPIN-POLARIZATION DEVICES USING RARE EARTH-TRANSITION METAL ALLOYS

(75) Inventors: Christian Kaiser, San Jose, CA (US); Stuart Stephen Papworth Parkin, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 53 days.

(21) Appl. No.: 10/908,530

(22) Filed: May 16, 2005

(65) Prior Publication Data
US 2006/0255383 A1    Nov. 16, 2006

(51) Int. Cl.
*H01L 29/06* (2006.01)
*H01L 29/08* (2006.01)
*H01L 39/00* (2006.01)

(52) U.S. Cl. ......... 257/30; 257/E43.005; 257/E21.665; 365/173

(58) Field of Classification Search ................ 257/30, 257/E43.005, E21.665
See application file for complete search history.

(56) References Cited

U.S. PATENT DOCUMENTS

| | | | |
|---|---|---|---|
| 6,760,201 | B2 | 7/2004 | Nakashio et al. |
| 6,791,866 | B2 | 9/2004 | Ikeda |
| 6,795,281 | B2 | 9/2004 | Tran et al. |
| 2003/0161181 | A1 | 8/2003 | Saito et al. |
| 2004/0076036 | A1* | 4/2004 | Heide .................. 365/173 |
| 2004/0184199 | A1 | 9/2004 | Nakashio et al. |
| 2004/0223267 | A1 | 11/2004 | Childress et al. |
| 2004/0233761 | A1* | 11/2004 | Schwabe et al. ........... 365/222 |
| 2004/0257719 | A1 | 12/2004 | Ohba et al. |
| 2004/0264068 | A1 | 12/2004 | Kanaya et al. |
| 2005/0207070 | A1* | 9/2005 | Carey et al. .............. 360/324.1 |
| 2005/0207073 | A1* | 9/2005 | Carey et al. ........... 360/324.12 |
| 2005/0226043 | A1* | 10/2005 | Parkin et al. ................ 365/173 |
| 2006/0221509 | A1* | 10/2006 | Carey et al. .............. 360/324.2 |

FOREIGN PATENT DOCUMENTS

| | | |
|---|---|---|
| JP | 08-018111 | 1/1996 |
| JP | 2003-115621 | 4/2003 |

OTHER PUBLICATIONS

P. Hansen et al., "Magnetic and magneto-optical properties of rare-earth transition-metal alloys containing Gd, Tb, Fe, Co", J. Appl. Phys., vol. 66, No. 2, Jul. 15, 1989, pp. 756-767.

P. Hansen et al., "Magnetic and magneto-optical properties of rare-earth transition-metal alloys containing Dy, Ho, Fe, Co", J. Appl. Phys., vol. 69, No. 5, Mar. 1, 1991, pp. 3194-3207.

N. Nishimura et al., "Magnetic tunnel junction device with perpendicular magnetization films for high-density magnetic random access memory", J. Appl. Phys., vol. 91, No. 8, Apr. 15, 2002, pp. 5246-5249.

(Continued)

*Primary Examiner*—Ngân V. Ngô
(74) *Attorney, Agent, or Firm*—Daniel E. Johnson

(57) ABSTRACT

A tunnel barrier in proximity with a layer of a rare earth element-transition metal (RE—TM) alloy forms a device that passes negatively spin-polarized current. The rare earth element includes at least one element selected from the group consisting of Gd, Tb, Dy, Ho, Er, Tm, and Yb. The RE and TM have respective sub-network moments such that the absolute magnitude of the RE sub-network moment is greater than the absolute magnitude of the TM sub-network moment. An additional layer of magnetic material may be used in combination with the tunnel barrier and the RE—TM alloy layer to form a magnetic tunnel junction. Still other layers of tunnel barrier and magnetic material may be used in combination with the foregoing to form a flux-closed double tunnel junction device.

49 Claims, 26 Drawing Sheets

OTHER PUBLICATIONS

S. Parkin et al., "Giant tunnelling magnetoresistance at room temperature with MgO (100) tunnel barriers", Nature Materials, vol. 3, Dec. 2004, pp. 862-867.

C. Bellouard et al., "Negative spin-valve effect in Co65Fe35/Ag/ (Co65Fe35)50Gd50 trilayers", Physical Review B, vol. 53, No. 9, Mar. 1, 1996-I, pp. 5082-5085.

S. Parkin et al., "Oscillations in Exchange Coupling and Magnetoresistance in Metallic Superlattice Structures: Co/Ru, Co/Cr, and Fe/Cr", Phys. Review Letters, vol. 64, No. 19, May 7, 1990, pp. 2304-2308.

J. M. De Teresa et al., "Inverse Tunnel Magnetoresistance in Co/SrTiO /Lao,7Sr0, MnO : New Ideas on Spin-Polarized Tunneling", Phys. Review Letters, vol. 82, No. 21, May 24, 1999, pp. 4288-4291.

D. C. Worledge et al., "Negative Spin-Polarization of SrRuO3", Phys. Review Letters, vol. 85, No. 24, Dec. 11, 2000, pp. 5182-5185.

V. G. Harris et al., Selective-Resputtering-Induced Perpendicular Magnetic Anisotropy in Amorphous TbFe Films, Phys. Review Letters, vol. 87, No. 6, Aug. 6, 2001, pp. 067207-1 through 067207-4.

S. Parkin et al, "Magnetically Engineered Spintronic Sensors and Memory", Proc. of IEEE, vol. 91, No. 5, May 2003, pp. 661-680.

* cited by examiner ferrimagnetic
(Co-Gd)

sperimagnetic
(Co-Dy)

speromagnetic
(Co-Nd)

SPIN-POLARIZATION DEVICES USING RARE EARTH-TRANSITION METAL ALLOYS

The U.S. Government has a paid-up license in this invention and the right in limited circumstances to require the patent owner to license others on reasonable terms as provided for by the terms of contract MDA972-01-C-0051 awarded by DARPA.

TECHNICAL FIELD

The invention relates to devices that pass spin-polarized current, such as magnetic tunnel junctions, and more particularly to the use of rare earth-transition metal alloys in such devices.

BACKGROUND OF THE INVENTION

Magnetic tunnel junctions (MTJs) generally consist of sandwiches of two thin ferromagnetic (FM) metallic films separated by a thin (e.g., ~5-30 Å) insulating barrier (I). Application of a voltage bias across the electrodes leads to a tunneling current whose magnitude depends on the relative orientation of the magnetic moments of the two ferromagnetic layers. For conventional ferromagnetic metals (e.g., Co, Fe, and Ni and their binary or ternary alloys) the resistance is usually higher when the magnetizations of the two electrodes are anti-parallel as compared to parallel. The relative change in resistance is defined as the tunneling magnetoresistance (TMR)

$$TMR = \frac{R_{AP} - R_P}{R_P}$$

where $R_{AP}$ and $R_P$ denote the junction resistance for anti-parallel (AP) and parallel (P) alignment, respectively. The first successful tunnel junction was prepared by Julliere in the early 1970s[1]. Julliere used Co and Fe as electrode materials and Ge which was oxidized after deposition as the insulating barrier. A TMR as high as 14% was observed at low temperatures and very low bias. In 1995 two different groups (Miyazaki et al.[2] and Moodera et al.[3]) prepared MTJs using amorphous $Al_2O_3$ barriers and achieved TMR values much higher than previously reported (~10% at room temperature and ~30% at 4.2 K). These results sparked tremendous interest in magnetic tunnel junctions, largely due to their potential for applications in advanced recording read heads for magnetic hard disk drives and novel magnetic random access memories (MRAM)[4]. For MRAM applications the parallel and anti-parallel orientations of the magnetic electrodes of the MTJ correspond to the two states of the memory cell. Thus, these magnetic states must be well defined and stable in the absence of magnetic fields.

In order to be able to set the magnetic state of an MTJ to the parallel or anti-parallel magnetization states, the two ferromagnetic layers may be designed to have different magnetic switching fields (coercive field), as discussed in IBM's U.S. Pat. No. 5,801,984 entitled "Magnetic tunnel junction with ferromagnetic multilayer having fixed magnetic moment", to S. S. P. Parkin, or one of them may be exchange biased as discussed in IBM's U.S. Pat. No. 5,650,958 entitled "Magnetic tunnel junctions with controlled magnetic response", to W. J. Gallagher et al. When a ferromagnetic layer is deposited adjacent to a layer comprised of an antiferromagnetic (AF) material, its magnetic hysteresis loop may be shifted or exchange-biased with respect to zero field[5]. While both approaches have been successfully used in tunnel junctions, exchange biased MTJs are preferred for MRAM and reading head applications because such devices are stable to larger magnetic fields and typically show more reproducible switching characteristics[4].

FIG. 1 shows a schematic drawing of a prior art MTJ. The multilayer structure is grown onto a substrate 11 which is typically an amorphous layer of $SiO_2$ although this may also be a metal layer such as TaN or Cu. The bottom ferromagnetic layer 30 is exchange biased by growing it onto an antiferromagnetic material 20, such as an alloy of Mn with Fe, Ir or Pt, while layer 10 is one or more seed layers that promotes proper growth of the layers above it and also may provide sufficient conductivity for the lower electrode. The tunnel barrier, which in prior art structures is typically comprised of an amorphous layer of $Al_2O_3$, is indicated as layer 40 in FIG. 1, and the upper ferromagnetic layer as layer 60. The exchange biased magnetic layer 30 is the reference magnetic electrode, whose magnetization direction (indicated by the arrow 100) is unchanged during the operation of the device. The magnetic layer 60 is the storage layer in an MRAM device whose moment direction, indicated by the arrow 80 in FIG. 1, can be switched back and forth to point either parallel or anti-parallel to the magnetization direction of the pinned layer (arrow 100). The magnetic electrode 60 is capped by layer 70 which serves several purposes including: the prevention of the deterioration (for example, by oxidation) of the top magnetic electrode, improved thermal stability of the device, and for ease of integration with conventional CMOS circuits. The ferromagnetic electrodes 30 and 60 are typically comprised of transition metal ferromagnets (Fe, Co or Ni) or alloys of these elements.

A magnetic material has a different number of occupied electronic states of majority and minority spin character. The difference in the number of filled states with up-spin (majority) and down-spin (minority) spin electrons determines the net magnetic moment per atom of the material. In a metallic magnetic material it can be that the number of filled electronic states at the Fermi energy (the energy of the highest occupied state at zero temperature) of spin-up and spin-down character can be different. Thus, when current tunnels from such a metal across a tunnel barrier the current will be spin polarized. The degree of spin polarization of the tunneling current will depend, in a first approximation, on the ratio of the number of up-spin to down-spin filled states in the magnetic metal, but also depends on the tunneling probability from these states. Since the majority and minority spin states will likely have different symmetries, the tunneling probability will also likely be different, thereby influencing the spin polarization of the current. By definition, the polarization of the current is described as being positive when the current is comprised of a larger number of electrons with majority spin character than minority spin character: there are, by definition, more electrons in filled majority spin states. The magnetic moment of such a metal is, by definition, aligned along the moment direction of the majority spin electrons, so that the polarization of a positive current is similarly along this moment direction.

An explanation for the tunneling magneto resistance phenomenon was first given by Julliere[1]. Based on the prior work of Meservey and Tedrow[6] who had investigated tunneling between ferromagnetic and superconducting electrodes, Julliere[1] derived a formula for the relationship between TMR and the polarizations of the electrodes $P_{1,2}$ as follows:

$$TMR = \frac{2P_1 P_2}{1 - P_1 P_2}$$

where $P_{1,2}$ can be generalized to $$P_{1,2} = \frac{|w_\uparrow||N_\uparrow| - |w_\downarrow||N_\downarrow|}{|w_\uparrow||N_\uparrow| + |w_\downarrow||N_\downarrow|}$$

Here $N_{\uparrow,\downarrow}$ are the density of states at the Fermi energy for the spin-up and spin-down electrons, respectively, and $|w_{\uparrow,\downarrow}|$ are spin-dependent weighting functions which depend on details of the wave functions and thus the tunneling probabilities for the tunneling of spin-up and spin-down electrons, respectively. The spin polarizations $P_{1,2}$ of the ferromagnet/insulator interface can be measured directly at low temperatures (<0.4 K) and at very low bias (~1 mV) using superconducting tunneling spectroscopy (STS). In these experiments one of the electrodes of the MTJ is replaced by a thin superconducting film which acts as an analyzer of the spin polarized tunneling current from the magnetic counter-electrode. The TMR values calculated using Julliere's formula and spin polarization values from STS studies are usually an upper bound on the experimentally measured TMR values at low temperatures and low applied bias.

Since the early 1970s the spin polarizations of a large variety of magnetic materials have been measured. Meservey and Tedrow[6] found that the tunneling spin polarizations (TSPs) of Co, Fe and Ni as well as alloys of these elements were always positive (i.e., majority spin polarized). Moreover, the TSP of these elements are similar in magnitude[7]. Although Ni and Ni-rich alloys often show low TSP values as compared with Fe and Co-rich alloys, this is most likely due to problems in creating a high quality interface with the tunneling barrier. Indeed, recent experiments show that it is possible to obtain TSP values for Ni which are similar to those found for Co and Fe[8,9].

Measurements by the Meservey-Tedrow group of the tunneling spin polarization of a large number of alloys of the ferromagnetic 3d transition metal alloys with paramagnetic diluents showed that, in general, the polarization of these alloys scaled approximately linearly with the magnetization of the alloy. For example, Paraskevopoulos et al. reported extensive studies of Ni alloyed with Cr, Cu, Fe, Mn and Ti[10]. However, the TSP of Ni and these alloys was very low, and it is now believed that the proportionality of TSP and the magnetic moment observed in these alloys was an artifact of intermixing at the F/I interface and the relatively poor quality of the growth of these structures. More recently, it has been found that, at least for alloys formed from amongst the 3d elements Ni, Fe and Co, the TSP bears little relationship to the magnetization of the alloy. This was demonstrated very clearly in measurements of the spin polarization of Co—Pt and Co—Pd alloys for which the TSP was found to vary little even when significant amounts of Pt or Pd are added to Co[11]. The TSP was found to be approximately constant up to ~40 atomic % Pt (or Pd) even though the magnetization of the alloys was significantly lowered. By contrast, the addition of most other transition metal paramagnetic diluents does indeed result in a reduction of both TSP and magnetization.

The TSPs of many other magnetic materials have been measured over the past twenty years or so, including those of the rare earth metals (Gd, Tb, Dy, Ho, Er, Tm), as well as more complex materials such as various Heusler alloys, and several perovskites. All the rare earth metals show positive TSP values although these are much lower than those of the ferromagnetic 3d transition metals. Much attention has been focused on materials which are predicted to be half metallic ferromagnets such as NiMnSb, $CrO_2$, $Fe_3O_4$, and $La_{1-x}Sr_xMnO_3$, although, with the exception of $CrO_2$ and $La_{1-x}Sr_xMnO_3$, none of these have shown fully or even nearly fully polarized electron currents. Moreover, no MTJs have been grown with $CrO_2$ which show significant TMR, and the TMR exhibited by MTJs with $La_{1-x}Sr_xMnO_3$ decreases to very low values at temperatures well below the Curie temperature of these oxides.

Although a wide range of magnetic materials have been explored only two to date, magnetite (i.e., $Fe_3O_4$) and $SrRuO_3$, show negative TSP (i.e., tunneling current dominated by the minority spin polarized electrons). Magnetite, which is predicted to be a minority spin-polarized metal at room temperature (i.e., no majority spin polarized states at the Fermi energy) undergoes a metal-insulator transition at ~120 K—the Vervey transition—below which temperature a gap in the minority density of states opens[12]. Thus the material becomes an insulator. However, there is still enough conductance through sufficiently thin $Fe_3O_4$ layers, because of hopping conductance through these layer, for STS experiments to determine a TSP of the tunneling electrons. The magnetite layer, because of different tunnel barrier heights for the minority and majority spin polarized electrons, will also give rise to a spin-filtering effect of the hopping/tunneling electrons. Using an $Al_2O_3$ barrier, TSP values of up to −48% have been measured[13]. By contrast, the magnitude of TSP values found for $SrRuO_3$, measured using a $SrTiO_3$ (STO) barrier, are much smaller, only −13%[14]. Moreover, $SrRuO_3$ is not useful for device applications, since its Curie temperature is well below room temperature (~150 K).

In prior art MRAM devices, the ferromagnetic 3d transition metals (Co, Fe, and Ni) and their alloys have predominantly been used because of their ease of fabrication, high Curie temperatures and well explored magnetic properties[4]. Equally important, using exchange bias[5] and oscillatory interlayer coupling[15] thin film structures of transition metals can be magnetically engineered to create useful devices. Moreover, their magnetic properties (e.g., saturation and remanent magnetization, coercivity, anisotropy, magnetostriction, etc.) can be tailored by alloying Co, Fe, and Ni with other ferromagnetic or non-magnetic elements. For example, $Co_{70}Fe_{30}$ and amorphous alloys of CoFe formed by alloying with glass forming elements, are typically used in prior art MTJ electrodes as the spin-polarization of these alloys typically exceeds the polarization of the pure Co or Fe metals[7] and, moreover, gives rise to more thermally stable devices.

While the spin-dependent transport properties of ferromagnetic transition metal alloys with paramagnetic 3d, 4d and 5d elements have been studied for many years, much less attention has been focused on alloys of Co, Fe and Ni with the magnetic 4f elements (the lanthanides or rare earth elements). Of particular interest are alloys of the heavy rare-earth elements (RE) and the 3d transition metals (TM) because in these RE—TM alloys the RE moment is aligned in an opposite direction to that of the TM moment. In some cases the RE and TM moments are aligned exactly anti-parallel to one another to form a ferrimagnetic alloy. In other cases the alignment of the RE and TM moments may not be exactly anti-parallel but the moments may be at some angle to each other which is greater than 90 degree so forming sperimagnetic alloys. For both ferrimagnetic and sperimagnetic RE—TM alloys the magnetization can be much smaller than that of the TM elements themselves. These are the RE—TM alloys of interest here. In the subsequent description of these alloys we will refer to them as ferrimagnetic even though the RE and TM moments may not be exactly anti-parallel to each other.

In general, the heavy rare-earth elements include Gd and the rare-earth elements with higher number of 4f electrons. However, only RE elements which exhibit a magnetic moment in ferrimagnetic RE—TM alloys are of interest here. Lu has a filled 4f shell and is always non-magnetic, and Yb, which has an incomplete 4f shell (13 4f electrons), is non-magnetic in the elemental metal. In compounds, Yb may exhibit a magnetic moment.

In addition to ferrimagnetic ordering and consequent low magnetization values, RE—TM alloys have other desirable properties including: their ability to form amorphous structures in the absence of additional glass forming elements, and perpendicular magnetic anisotropy in thin films. These properties make such alloys useful for various applications, especially magneto-optical storage media. For this application, the amorphous structure (which reduces the grain noise), tunable Curie temperature (which enables Curie point writing[16,17]) and perpendicular anisotropy[18] are most important. Thus, much attention has been focused in the literature on Co—Fe—Gd—Tb alloys with perpendicular anisotropy and a Curie temperature above room temperature.

The magnetic properties of the rare earths are dominated by a partly filled 4f shell which can result in very high magnetic moments per atom. These moments are exchange coupled via the Ruderman-Kittel-Kasuya-Yosida (RKKY) interaction mediated via the 4s-5d conduction electrons. The Curie temperatures of the ferromagnetic RE metals are, however, much lower than those of the 3d based ferromagnets; Gd is the only RE element which is ferromagnetic at temperatures near room temperature.

Films of RE—TM alloys can be prepared so that they are either crystalline or amorphous. Various deposition methods have been used to create amorphous films including sputtering, thermal evaporation, and liquid quenching. The crystallization temperatures are well above room temperature (see reference[19] for a compilation of temperatures). When alloyed with the 3d ferromagnetic elements Co, Fe or Ni, the RE elements retain their high moments to higher temperatures than the Curie temperatures of the elemental REs. Indeed, early research on RE—TM alloys focused on their use in permanent magnets[20] by combining the high Curie temperature of the TM with the high magnetic moment of the RE element. The light RE elements were used for this application because their moments couple ferromagnetically with those of the TM elements so giving rise to high net magnetizations.

By contrast, the moments of the heavy rare earth elements couple antiferromagnetically with the TM moments, thereby reducing the net moment of the heavy RE—TM alloy. This can be readily understood from Hund's rule. Hund's rule states that for RE elements with less than half-filled shells, their orbital and spin moments are coupled anti-parallel to one another (J=L−S), whereas they are coupled parallel (J=L+S) for the second half of the RE series (including Gd). Theoretically, the orbital moment of the RE atom is always equal to or greater than its spin moment (with the exception of Gd which has no orbital moment (L=0)). Thus, for the light RE elements, the total moment is always anti-parallel to the spin moment. Because the 4f spin moment couples anti-parallel to the TM moment (mediated through positive 4f-5d and negative 5d-3d exchange[21]) the total moment on the RE couples parallel to the TM for the light REs and anti-parallel for the heavy REs. The relative orientation between the spin and orbital moments is schematically illustrated in FIG. 2.

It follows from the above discussion that alloys between light RE and TM are ferromagnets while alloys between heavy RE and TM are ferrimagnets. However, in amorphous alloys, the situation is more complicated than depicted in FIG. 2. Because the local easy magnetic axis for the magnetization varies randomly from site to site due to variations in the local crystalline fields, the RE and TM moments will be canted with respect to moments of the same or the other elements[22]. This randomizing of the orientation of the magnetic moments is opposed by the exchange interaction which favors parallel (or anti-parallel) alignment. Typical spin structures, observed in experiments, are depicted in FIG. 3. Gd based alloys show a collinear structure, as Gd has no orbital moment (L=0) and thus no significant crystalline anisotropy. For Co—Dy and Co—Nd, the RE sub-network moments are canted with respect to the Co moments, which are themselves parallel to each other due to Co—Co ferromagnetic exchange coupling.

The magnetic moments on the individual atoms of the RE or TM components of the RE—TM alloy adds up to a so-called RE or TM sub-network magnetization. Here the term sub-network magnetization is used rather than sub-lattice magnetization because of the amorphous structure. The combination of both the RE and TM sub-network magnetizations adds up to the net magnetization of the alloy. The ferrimagnetic ordering of the RE and TM sub-network magnetizations leads to an interesting dependence of the net magnetization of the RE—TM alloy on composition and temperature. By varying the relative composition of the RE and TM components dramatic changes in the net magnetization result. At a certain composition—the compensation composition—the sub-network magnetizations exactly cancel each other out, leading to zero net magnetization of the RE—TM alloy. For Co—Gd alloys this compensation composition corresponds to ~20 atomic % Gd[23], whereas for Fe—Gd the compensation composition is slightly higher at ~22 atomic % Gd because of the larger Fe moment compared to that of Co.

A similar compensation behavior can be seen in the temperature dependence of the magnetization of the heavy RE—TM alloys. The RE sub-network magnetization is more strongly temperature dependent than that of the TM sub-network so that the relative magnitude of the sub-network magnetizations changes with temperature. The Curie temperature also changes with composition. A similar compensation behavior is found for many alloys of the transition metals Co, Fe, or Ni and the heavy RE elements. In these alloys the TM subnetwork magnetization is oriented anti-parallel to that of the RE sub-network magnetization. The detailed magnetic structure may be complex (see FIG. 3) so that the individual RE moments may be aligned nearly anti-parallel to the neighboring TM moments, to give rise to a collinear ferrimagnetic structure, or they may be aligned at some angle (typically greater than 90 degree) to the neighboring RE moments, so giving rise, for example, to a sperimagnetic structure[24]. In any case, the RE and TM sub-network magnetizations are aligned in such a way that they compensate one another so as to reduce the net magnetization of the RE—TM alloy. These ferromagnetic alloys of heavy REs and TMs are of interest here.

Many heavy RE—TM alloy films display perpendicular magnetic anisotropy (PMA), depending on their structure and method of deposition. Perhaps the most extensively studied alloys are those of Co and Fe with Tb and Gd (e.g., Co—Gd, Fe—Gd, Co—Tb, and Fe—Tb and CoFeGd and CoFeTb). The magnitude and sign (whether the easy axis is perpendicular or within the film plane) of the PMA is strongly affected by the deposition technique and the deposition conditions for otherwise the same alloy composition[19]. For example, for both electron beam evaporation[25,26,23] and sputtering[27,28] deposition techniques, both in-plane and out-of-plane anisotropy are found in Co—Gd alloys. The PMA magnitude and sign are influenced by the target composition, deposition parameters such as substrate bias and power, sputter gas pressure, deposition temperature, magnetic fields applied during deposition, and oxygen incorporation[29], as well as the substrate itself. Furthermore, thermal annealing and ion irradiation considerably change the properties of the materials and usually decrease the magnitude of the PMA constant[30,31,32,33].

Magnetic anisotropy can have diverse origins. Stress can induce anisotropy via the inverse magnetostriction effect. However, experimental results indicate that stress does not play a major role in determining the anisotropy of, for example, Fe—Tb films[34]. Similarly, it was shown that shape anisotropy due to columnar microstructure and voids also does not play a dominant role[35]. Another mechanism for PMA is magneto-crystalline anisotropy due to atomic non-spherical electron density distributions which give rise to orbital moments coupled to spin moments. The interaction with the charge distribution of neighboring atoms (in the case of long range order) introduces a crystal field that leads to magneto-crystalline anisotropy. In the amorphous RE—TM alloys, where there is no long range order, magneto-crystalline anisotropy can be ruled out as the dominant mechanism for magnetic anisotropy.

However, short range order can introduce a local field which can give rise to anisotropy even in the absence of crystallinity. This short range order can be introduced via compositional directional short range ordering (CDSRO), which is an anisotropic environment of nearest neighbors for a given element. A special case of CDSRO is atom pair ordering[36,37]. CDSRO has been experimentally confirmed in sputtered Fe—Tb films by characterizing the details of the atomic arrangements using the EXAFS (extended x-ray absorption fine structure) technique. Harris et al. showed that there is a significant difference in the relative numbers of Fe and Tb nearest neighbors within the film plane as compared to out of the film plane[38]. This difference had been predicted from models of the deposition of RE—TM alloy films in which selective re-sputtering takes place. This model assumes that atoms sputter-deposited on the surface of the growing film can be selectively removed from particular atomic sites during the sputter deposition process because of significant differences in binding energies at these various sites. The binding energy depends on details of the local atomic environment of the surface atoms at such sites. This model can account for the strong influence of substrate bias and sputter gas pressure on the magnitude of the anisotropy found experimentally.

Although the tunneling spin polarizations of numerous magnetic materials have been measured, there are no reports of measurements on RE—TM alloys. This is probably because the spin polarization of the RE elements was found to be small, making these materials of lesser interest, and also because of the high reactivity of RE metals, particularly with regard to oxygen. The heat of formation of RE oxides is very high, so that there was a presumption that RE metals adjacent to an oxide tunnel barrier would likely be oxidized so inevitably reducing the spin polarization. Thus a means of taking advantage of the unique properties of RE is needed. Nishimura et al.[39] describe the use of RE—TM alloy magnetic electrodes comprised of GdFeCo and TbFeCo in MTJs where the interfaces with the RE—TM alloy layers and an alumina tunnel barrier are covered with thin CoFe layers. However, Nishimura et al. describe MTJ structures in which the moment of each RE—TM alloy layer is coupled ferromagnetically with that of the corresponding CoFe interface layer, and in which the moments of the RE—TM/CoFe bi-layers are oriented perpendicular to the film plane[39]. Previously, RE—TM alloys have also been used as electrodes in metallic spin-valve structures although with no advantageous properties[40].

The low magnetization of ferrimagnetic heavy RE—TM alloys is very attractive for applications as MRAM storage elements or magnetic recording read heads and other sensors because, as these magnetic devices are shrunk in size to deep sub-micron dimensions, the magnetic dipolar fields from the edges of the magnetic films in these devices become ever larger, thereby leading to large magnetic interactions between magnetic layers within individual devices or between neighboring devices. It would be advantageous to introduce into such devices means of reducing or controlling these dipolar fields.

One such means might be the use of synthetic antiferromagnetic magnetic electrodes, in which the ferromagnetic reference and/or storage layers are replaced by sandwiches of two ferromagnetic films that are strongly coupled antiferromagnetically by means of a metallic antiferromagnetic coupling spacer layer typically comprised of Ru, as described in U.S. Pat. No. 5,841,692 ("Magnetic tunnel junction device with antiferromagnetically coupled pinned layer" to W. J. Gallagher et al.) and U.S. Pat. No. 6,153,320 ("Magnetic devices with laminated ferromagnetic structures formed with improved aniferromagnetically coupling films" to S. S. P. Parkin). Such structures use very thin antiferromagnetically coupling films just a few angstroms thick, which are not necessarily highly thermally stable. However, alternate means of providing flux closed MTJ devices that do not require the use of ultra thin layers would be highly desirable.

SUMMARY OF THE INVENTION

One embodiment of the invention is a device that includes a first tunnel barrier and a first layer that includes a rare earth element-transition metal (RE—TM) alloy in proximity with the first tunnel barrier. The rare earth element includes at least one element selected from the group consisting of Gd, Tb, Dy, Ho, Er, Tm, and Yb. The RE and TM have respective sub-network moments such that the absolute magnitude of the RE sub-network moment is greater than the absolute magnitude of the TM sub-network moment. Also, the respective RE and TM sub-network moments and concentrations are selected to enable negatively spin-polarized current to pass between the first tunnel barrier and the RE—TM layer at room temperature. The tunnel barrier may include at least one of a MgO tunnel barrier and a Mg—ZnO tunnel barrier (see U.S. patent application Ser. No. 10/973, 954 to Parkin titled "MgO tunnel barriers and method of formation" filed Oct. 25, 2004, which is hereby incorporated by reference; and U.S. patent application Ser. No. 10/982, 075 titled "Mg—Zn oxide tunnel barriers and method of formation" filed Nov. 5, 2004, which is hereby incorporated by reference), or the first tunnel barrier may be selected from the group consisting of $Al_2O_3$, $Ga_2O_3$, AlN, and GaN (see U.S. Pat. No. 6,359,289 to Parkin, which is hereby incorporated by reference). The RE—TM alloy may advantageously include at least one of Co—Gd, CoFe—Gd, Tb—Fe, Co—Tb, and CoFe—Tb; for example, the RE—TM alloy may include a CoGd alloy having a Gd content of between 25 and 60 atomic percent, or between 25 and 80 atomic percent. The alloy may advantageously have a composition near the compensation point, so that the alloy has, at room temperature, a magnetization that is less than 500 emu/cm$^3$ and a tunneling spin polarization whose magnitude is at least 50%, e.g., the spin polarization may be ±50%. (In this case, the RE component of the alloy may have a concentration as low as 20 atomic %.) The thickness of the RE—TM alloy layer is preferably between 25 and 500 Å. The RE—TM alloy may be magnetized in a direction perpendicular to a plane along which the RE—TM layer is oriented, or in a direction parallel to a plane along which the RE—TM layer is oriented. It preferably has a magnetic anisotropy of less than 50 Oersteds or even less than 10 Oersteds. The RE and TM may be antiferromagnetically coupled.

The device may further comprise a second layer that includes magnetic material selected from the group of materials consisting of ferromagnetic materials and ferrimagnetic materials, in which the second layer is in proximity with the first tunnel barrier, so that the device forms a magnetic tunnel junction. The RE—TM alloy may be selected so that the device has a negative tunneling magnetoresistance at one temperature but a positive tunneling magnetoresistance at another temperature. Also, the device may further comprise an interface layer (such as a bcc Co—Fe alloy) between the first tunnel barrier and the RE—TM layer, in which the interface layer is selected to increase at least one of: i) the absolute value of the tunneling magnetoresistance of the magnetic tunnel junction and ii) the thermal stability of the magnetic tunnel junction. In addition, the device may further include a second tunnel barrier and a third layer that is positively spin-polarized and includes magnetic material selected from the group of materials consisting of ferromagnetic materials and ferrimagnetic materials. In this case, the second tunnel barrier is between the second layer and the third layer; the first layer, the first tunnel barrier, the second layer, the second tunnel barrier, and the third layer are configured to form a double tunnel junction device through which spin-polarized current can pass at room temperature.

Another embodiment of the invention is a device that includes a tunnel barrier and a first layer that includes a rare earth element-transition metal (RE—TM) alloy in proximity with the tunnel barrier. The RE is at least 25 atomic percent of the composition of the first layer (e.g., it may be greater than 30 atomic percent or greater than 35 atomic percent, and may be, for example, less than 50 atomic percent), and the RE and TM have respective sub-network moments such that the absolute magnitude of the RE sub-network moment is greater than the absolute magnitude of the TM sub-network moment, thereby enabling negatively spin-polarized current to pass between the tunnel barrier and the RE—TM layer at room temperature. The RE may be Gd, and the alloy may include at least one of Co—Gd, CoFe—Gd, Tb—Fe, Co—Tb, and CoFe—Tb. The RE—TM alloy may have a magnetic anisotropy of less than 20 Oersteds. The tunnel barrier may include at least one of a MgO tunnel barrier and a Mg—ZnO tunnel barrier. The device may further comprise a second layer that includes magnetic material selected from the group of materials consisting of ferromagnetic materials and ferrimagnetic materials, in which the second layer is in proximity with the first tunnel barrier, so that the device forms a magnetic tunnel junction. In this case, the magnetic tunnel junction is in a low resistance state when the first and second layers have respective magnetic moments that are aligned antiparallel, and is in a high resistance state when the respective magnetic moments are aligned parallel. The magnetic tunnel junction may advantageously have a tunneling magnetoresistance whose absolute magnitude is at least 20% or even 40% at room temperature.

Yet another embodiment of the invention is a double tunnel junction device that includes a first layer of magnetic material, a first tunnel barrier, a second layer of magnetic material, a second tunnel barrier, and a third layer of magnetic material. The first tunnel barrier is between and in proximity with the first and second layers, and the second tunnel barrier is between and in proximity with the second and third layers, thereby permitting spin-polarized current to pass through the device. Furthermore, one of the first and the third layers is negatively spin-polarized at room temperature, and the other one of the first and the third layers is positively spin-polarized at room temperature. The negatively spin-polarized layer may advantageously include an alloy of Gd, e.g., the Gd content of the alloy may be at least 25 atomic percent. Also, the negatively spin-polarized layer may include at least one element selected from the group consisting of Gd, Tb, Dy, Ho, Er, Tm, and Yb. The coercivity of the negatively spin-polarized layer may be advantageously greater than the coercivity of the positively spin-polarized layer, and the device preferably has a tunneling magnetoresistance whose absolute value is at least 30% at room temperature.

Still another embodiment of the invention is a device that includes a tunnel barrier and a layer that includes a rare earth element-transition metal (RE—TM) alloy in proximity with the tunnel barrier, thereby enabling spin-polarized current to pass between the tunnel barrier and the RE—TM layer. The RE—TM alloy is magnetized in a direction oriented along a plane of the RE—TM layer, and the rare earth element includes at least one element selected from the group consisting of Gd, Tb, Dy, Ho, Er, Tm, and Yb. The device may be designed so that positive spin-polarized current passes between the tunnel barrier and the RE—TM layer; alternatively, it may be designed so that negative spin-polarized current passes between the tunnel barrier and the RE—TM layer.

BRIEF DESCRIPTION OF THE DRAWINGS

FIGS. 5A, 5B, 5C, 5D, 5E, and 5F, shows conductance versus applied voltage curves for Co—Gd/barrier/superconductor junctions for various Co—Gd compositions with curves fitted to the experimental data points shown as solid lines. The fitting parameters are indicated in the Figure.

FIGS. 7A, 7B, 7C, and 7D, illustrates the relative orientation and magnitude of Co and Gd magnetic moments in Co—Gd alloys of various compositions as well as their orientation to an applied magnetic field.

FIGS. 8A and 8B, shows hysteresis loops of a $Co_{65}Gd_{35}$ film measured at room temperature in two orthogonal directions in the film plane.

FIGS. 9A, 9B, 9C, and 9D, shows saturation magnetization (FIG. 9A), coercivity (FIG. 9B), anisotropy field (FIG. 9C), and anisotropy constant (FIG. 9D) versus the Gd content for Co—Gd and Co—Fe—Gd alloys of various compositions, measured at room temperature. The open triangles in FIG. 9A indicate literature data from Hansen[23]. The lines in FIGS. 9B-9D are guides to the eye.

FIGS. 10A, 10B, 10C, and 10D, shows saturation magnetization (FIG. 10A), coercivity (FIG. 10B), anisotropy field (FIG. 10C), and anisotropy constant (FIG. 10D) versus film thickness for $Co_{44}Fe_{39}Gd_{17}$ and $Co_{58}Gd_{42}$ films, measured at room temperature.

FIGS. 11A and 11B, shows the anisotropy (measured at room temperature) versus film thickness for $Co_{44}Fe_{39}Gd_{17}$ (FIG. 11B) and $Co_{58}Gd_{42}$ (FIG. 11A) films after thermal annealing them at various temperatures.

FIGS. 12A and 12B, shows the remanent magnetization measured at room temperature along different directions in the film plane for a $Co_{58}Gd_{42}$ film after thermal annealing at 260° C. (FIG. 12A) and 300° C. (FIG. 12B).

FIGS. 14A, 14B, 14C, and 14D, shows cross sectional views of magnetic tunnel junctions formed in accordance with the prior art (FIGS. 14A and 14B) as well as MTJs of the present invention (FIGS. 14C and 14D) illustrating that the low and high resistance state is achieved for different orientations of the free magnetic layer (layers 60 and 61 respectively).

FIGS. 15A and 15B, shows the TMR (FIG. 15A) and free layer magnetic moment (FIG. 15B) versus temperature for a magnetic tunnel junction with a $Co_{70}Fe_{30}$ electrode and a $Co_{91}Gd_9$ counter electrode.

FIGS. 16A and 16B, shows the TMR (FIG. 16A) and free layer magnetic moment (FIG. 16B) versus temperature for a magnetic tunnel junction with a $Co_{70}Fe_{30}$ electrode and a $Co_{40}Gd_{60}$ counter electrode.

FIGS. 17A and 17B, shows the TMR (FIG. 17A) and free layer magnetic moment (FIG. 17B) versus temperature for a magnetic tunnel junction with a $Co_{70}Fe_{30}$ electrode and a $Co_{74}Gd_{26}$ counter electrode.

FIGS. 19A and 19B, shows free layer coercivity (FIG. 19A) and TMR (FIG. 19B) versus $Co_{70}Fe_{30}$ interlayer thickness for an MTJ with a $Co_{70}Fe_{30}$ pinned layer and a $Co_{35}Fe_{35}Gd_{30}$ free layer, measured at room temperature.

FIGS. 20A and 20B, shows free layer coercivity (FIG. 20A) and TMR (FIG. 20B) versus $Co_{35}Fe_{35}Gd_{30}$ free layer thickness for an MTJ with a $Co_{70}Fe_{30}$ pinned layer and a $Co_{70}Fe_{30}$ interlayer, measured at room temperature.

FIGS. 21A, 21B, 21C, and 21D, shows TMR and resistance versus thermal annealing temperature for samples with 15 Å (FIGS. 21A and 21C) and 30 Å (FIGS. 21B and 21D) $Co_{70}Fe_{30}$ interlayer thickness, measured at room temperature.

FIGS. 22A and 22B, shows TMR loops for samples with 25 Å (FIG. 22A) and 50 Å (FIG. 22B) $Co_{70}Fe_{30}$ interlayer thickness, measured at room temperature.

FIGS. 24A and 24B, shows TMR loops for double tunnel junctions measured at room temperature.

FIGS. 25A and 25B, shows TMR loops for DTJs with a negatively spin polarized middle electrode, measured at room temperature.

FIGS. 26A and 26B, shows TMR loops for a DTJ of the present invention, measured at room temperature.

DESCRIPTION OF THE PREFERRED EMBODIMENTS

The tunneling spin polarization of various RE—TM alloys was measured using superconducting tunneling spectroscopy (STS). Although these measurements are carried out at low temperatures and large magnetic fields, these studies allow the direct determination of the spin polarization of electrons tunneling from the RE—TM layer. The tunneling magnetoresistance of MTJ devices incorporating such layers is related to the magnitude of the spin polarization through Julliere's formula. However, the STS structures are in many ways simpler than MTJ devices with regard to the control of the magnetic orientation of the magnetic electrodes, so such studies provide a more direct and reliable measurement of the spin polarization of the tunneling current.

Figure 4:
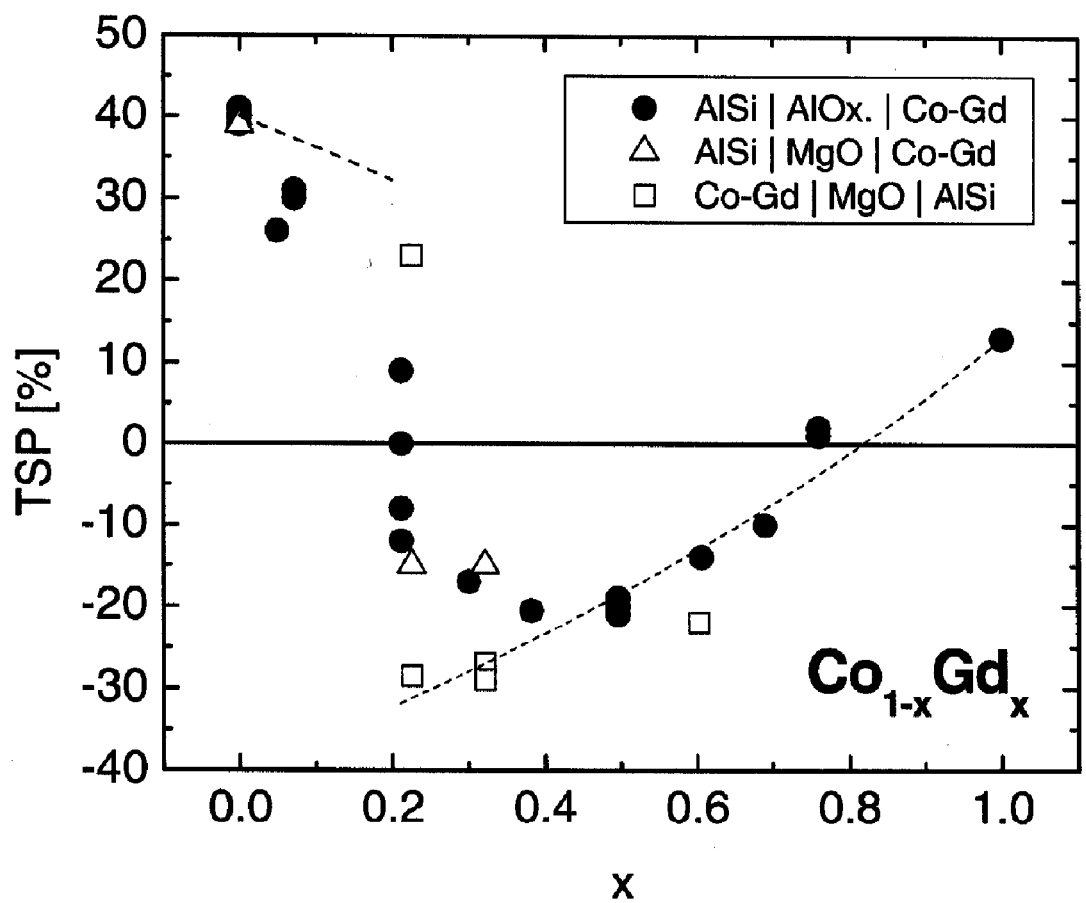
FIG. 4 shows the tunneling spin polarization for various $Co_{1-x}Gd_x$ alloys with $Al_2O_3$ and MgO barriers measured using superconducting tunneling spectroscopy, as a function of Gd concentration.

FIG. 4 shows the TSP measured at a temperature of 0.25 K and in an in-plane magnetic field of 2 T for Co—Gd alloys of various compositions using either $Al_2O_3$ or MgO tunnel barriers (I). The STS samples are comprised of shadow masked ferromagnet/insulator/superconductor (FIS) tunnel junctions with one electrode formed from the magnetic material (F) and the counter electrode formed from a thin film of a superconducting layer (S) of Al (which here is doped with a few percent of Si to increase its superconducting transition temperature to make the measurement easier). Two types of FIS samples were considered in which the superconducting electrode is either formed below the tunnel barrier, here termed n-FIS—a normal STS structure, or above the barrier, here termed i-FIS—an inverted STS structure. The solid circles in FIG. 4 indicate samples with $Al_2O_3$ barriers which are fabricated in the n-FIS structure.

Open triangles and squares indicate n-FIS and i-FIS structures, respectively, with MgO barriers. The structures were prepared by magnetron sputter deposition at ambient temperature in a high vacuum deposition chamber where the detailed layer sequences (from left to right) are as follows:
- 45 Å $Al_{96}Si_4$/14 Å Al/plasma oxidization treatment/300 Å $Co_{1-x}Gd_x$/100 Å Ta △ 45 Å $Al_{96}Si_4$/25 Å MgO/300 Å $Co_{1-x}Gd_x$/100 Å Ta □ 100 Å Ta/250 Å $Ir_{78}Mn_{22}$/35 Å $Co_{1-x}Gd_x$/25 Å MgO/60 Å $Al_{96}Si_4$ The $Al_2O_3$ barrier was formed by first sputter depositing a thin (~14 Å) Al layer in 3 mTorr argon sputter gas and then by plasma oxidizing this layer in 100 mTorr of pure oxygen for typical times ranging from 120 to 300 seconds. The MgO barrier was formed by reactive sputtering of a metallic Mg target in an $Ar-O_2$ gas mixture with typically 3 to 7 percent oxygen. Optimized tunnel barrier resistances for the STS measurements are obtained by varying the Al and MgO thicknesses, typically by a few Å, and by varying the plasma oxidization time for the Al films (typically from 180 s to 300 s). For the i-FIS samples the CoGd electrode barrier is grown on underlayers of Ta and IrMn. However, any exchange biasing of the CoGd layer by the antiferromagnetic IrMn layer is not important to the STS experiment as the samples are measured in a magnetic field (2T) which is much larger than the exchange bias field (~200 Oe). The Ta/IrMn underlayers are used rather to promote a smooth growth of the ferromagnetic layer and the tunnel barrier.

The Co—Gd layer is prepared by sputtering from an alloy target of the desired composition. However, the film composition may differ slightly from the target composition because sputtered Co and Gd atoms are scattered from the Ar atoms in the vacuum chamber at different rates due to their different masses relative to argon. More of the lighter Co atoms are scattered out of the sputtered beam compared to the heavier Gd atoms, leading to a higher Gd content in the deposited film. Thus, the sputter power and argon pressure during deposition influence the composition of the deposited film. The composition in the deposited films was measured using Rutherford Back Scattering Spectroscopy (RBS) on ~500 Å thick films of Co—Gd which were deposited in the same run as the samples for the STS experiments and protected from oxidation from the environment and from the $SiO_2$ substrate by ~100 Å of Ta deposited on the top and bottom of the film, respectively.

In FIG. 4 the compositions determined by RBS are used rather than the nominal compositions of the sputter targets. The data points in FIG. 4 corresponding to the same ~20 atomic % Gd are measured for Co—Gd alloys of nominally the same composition but are from different FIS samples fabricated in the same deposition run. The $Al_2O_3$ tunnel barriers in these samples were prepared using different plasma oxidation times but were otherwise identical. Presumably the CoGd interface is oxidized to lesser or greater amounts, thus changing the net composition of the Co—Gd layer very slightly.

Figure 5:
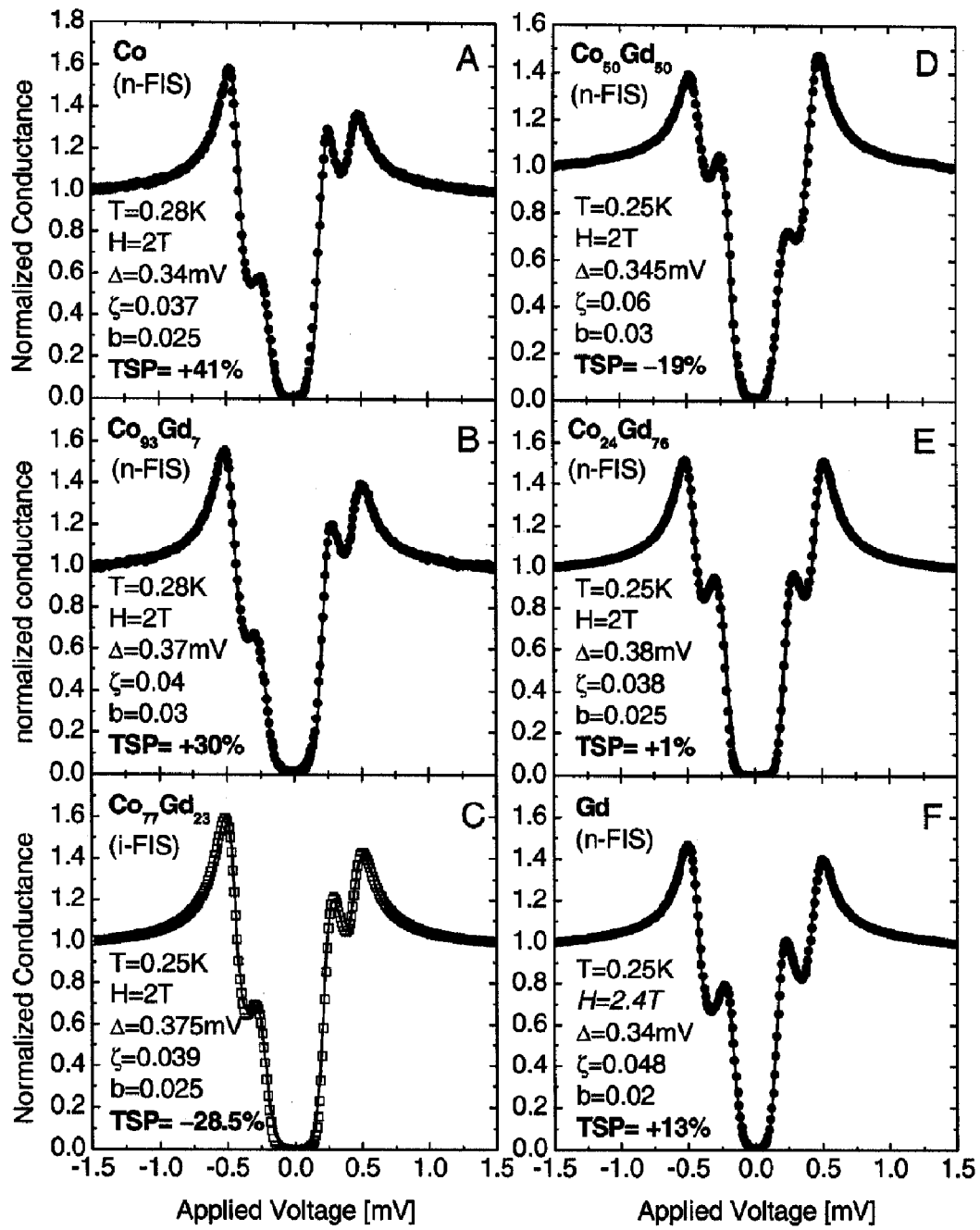
FIG. 5, which includes

FIG. 5 shows typical conductance versus voltage curves for FIS junctions using Co—Gd alloys of selected compositions from FIG. 4. Data (solid circles and open squares) for both n-FIS and i-FIS structures, respectively, are included. The data is fitted with standard theoretical models that allow the extraction of the tunneling spin polarization of the electrons: excellent fits to the data are obtained as shown by the solid lines in FIG. 5. The TSP can be determined with a precision of about ±1%.

Whereas the TSP of MgO based i-FIS junctions with conventional 3d transition metal ferromagnetic electrodes (e.g., $Co_{70}Fe_{30}$) shows greatly enhanced TSP values with anneal treatments (as disclosed in U.S. patent application Ser. No. 10/973,954 to Parkin titled "MgO tunnel barriers and method of formation" filed Oct. 25, 2004), the TSP of FIS structures containing $Al_2O_3$ barriers and similar ferromagnetic electrodes changes little for anneal temperatures up to ~400° C. By contrast, the TSP of FIS samples with Co—Gd electrodes decreases on annealing: their resistance also decreases. The most probable reason is the high reactivity of the Co—Gd alloys which likely become partly oxidized with oxygen derived from the $Al_2O_3$ barrier[33,41,42].

From FIG. 4 it can be seen that pure Co and Gd metals both have positive TSP with values of ~42% and ~13%, respectively. These results are the same to within experimental uncertainty as prior-art results[6,7,43,44]. However, FIG. 4 surprisingly shows that the TSP is negative for Co—Gd alloys with Gd contents ranging from ~20 to ~80 atomic %. The maximum negative TSP is found for Gd concentrations from ~22 to 30 atomic %, peaking at about -30% for $Co_{70}Gd_{30}$. The results for MgO and $Al_2O_3$ barriers are qualitatively the same. The samples with MgO barriers in the inverted FIS structure have higher negative TSP as compared to their counterparts in the normal FIS structure.

Both the RE and TM components of the RE—TM possess magnetic moments. As the relative proportion of RE to TM is changed, the relative magnitudes of the RE and TM sub-network magnetizations change. To verify that the STS samples indeed show this behavior, the saturation magnetizations of Co—Gd alloys of various compositions close to the compensation point were measured. The magnetization was measured at 10 K on small pieces of calibration films deposited in the same runs as the STS samples using a SQUID magnetometer. The saturation magnetization was determined by extrapolation to zero field of the moment versus field at high fields up to 5 T. These samples were typically ~500 Å thick. The actual thicknesses of these films were determined from mechanical profilometry.

Figure 6:
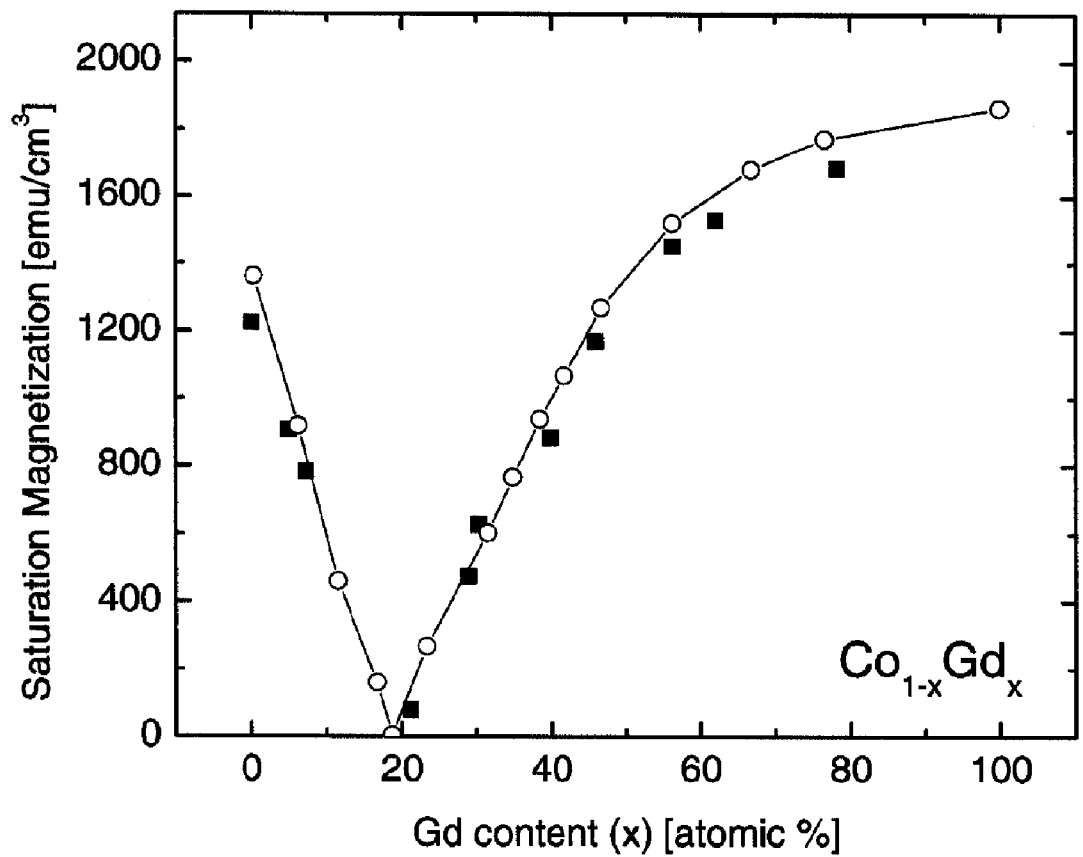
FIG. 6 shows experimentally determined and literature values of the saturation magnetization of $Co_{1-x}Gd_x$ alloys at 10 K, as a function of Gd content.

The volume magnetization, determined from the measured values of magnetization, area and thickness are shown as solid squares in FIG. 6. Excellent agreement is found with data from the literature (shown as open circles)[23]. The saturation magnetization (at 10K) vanishes at a compensation point, corresponding to ~19 atomic % Gd, which agrees well with the literature data. For lower Gd content the magnetization is dominated by the Co, whereas for higher Gd content the magnetization is dominated by the Gd component.

Figure 7:
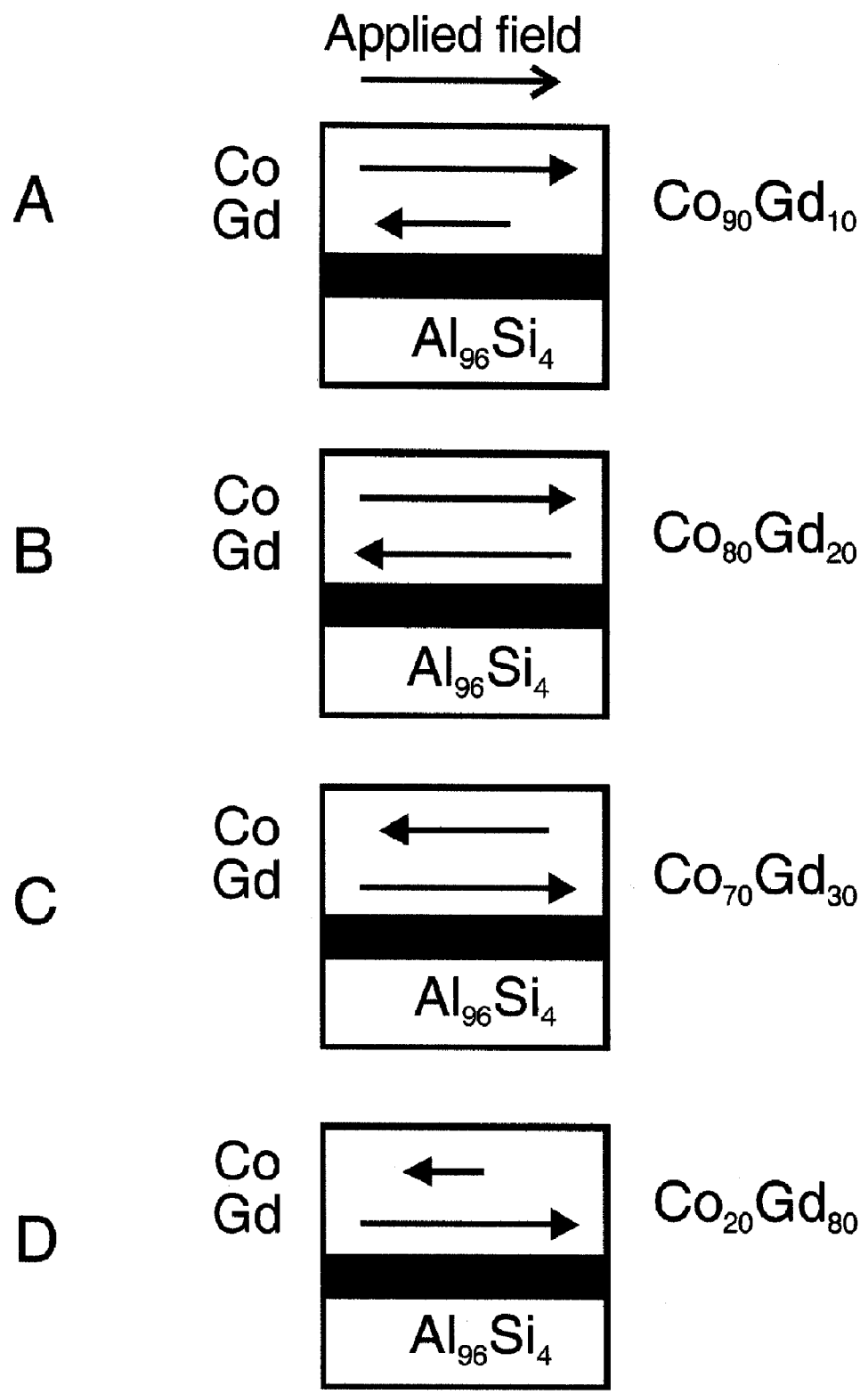
FIG. 7, which includes

Illustrative examples of the relative orientations of the RE and TM sub-network magnetizations are shown in FIG. 7, where the magnitude and direction of the sub-network magnetizations are shown for various Co—Gd compositions. At the compensation point (~20 atomic % Gd), the net magnetization vanishes. At this composition the orientations of the moments likely do not have a preferred direction with respect to the applied field but will depend on the anisotropy, thermal and magnetic field history, etc. For lower Gd concentrations, the Co sub-network magnetization is higher than that of the Gd sub-network (thus the Co sub-network is parallel to the applied field), while for higher Gd concentrations the relative orientation of the RE and TM moments with respect to the applied field reverses.

By comparing the dependence of TSP on Gd content in FIG. 4 with that of the magnetization in FIG. 6 it is clear that the change in sign of TSP takes place at the compensation concentration. Thus the TSP is positive when the Co moment dominates at lower Gd content and becomes negative when the Gd moment dominates at higher Gd contents. Thus, it can be concluded that the sign of the TSP is determined by the orientation of the Co sub-network magnetization with respect to the magnetic field. Thus, the sign of the TSP can be varied by manipulating the Co sub-network magnetization. Thus, ferromagnetic RE—TM alloys provide sources of both positively and negatively spin-polarized current.

Multiple data points are shown on FIG. 4 at the compensation point for nominally the same alloy $Co_{80}Gd_{20}$. These correspond to similar n-FIS structures which were fabricated with $Al_2O_3$ tunnel barriers prepared by depositing identical thicknesses of Al but by plasma—oxidizing these layers for different times. The TSP is found to vary from +9% to −13% for these samples. The fact that the magnetization of a $Co_{80}Gd_{20}$ calibration film made in the same deposition run was about 20 times smaller than that of a pure Co film suggests that the Co—Gd concentration is indeed at or close to the compensation point. Since the net moment is very small, the orientation of different regions of the CoGd layer (i.e., whether the Co or Gd sub-network magnetization is aligned with the field) is likely to vary randomly and, moreover, to be very sensitive to even very small changes in composition. Moreover, the likely poor alignment of the net sub-network moments with the field suggests that the observed TSP values are lower bounds on the values if there were more complete alignment of the RE and TM sub-network moments with the applied field. Furthermore, since the Co—Gd is deposited on top of the oxidized Al layers, the $Al_2O_3$/Co—Gd interface may be influenced by the degree of oxidation of the surface of the $Al_2O_3$ layer, which itself may be influenced by the plasma oxidization time. This may lead to slight changes in composition of the Co—Gd layer. The results presented in FIGS. 4 and 6 demonstrate the surprising result that a magnetic alloy with nearly zero magnetic moment can, nevertheless, display large tunneling spin polarization values. As discussed herein, such low moment materials can be employed in various applications of spin-dependent tunneling devices.

The dependence of TSP on Gd content shown in FIG. 4 can be explained by modeling the tunneling current across the junction as being comprised of two independent contributions from the Co and Gd atoms at the tunnel barrier interface. Each current component will depend on the respective spin polarization and tunneling probability from the Co and Gd sites, respectively. Thus, the overall spin polarization can be written as $$TSP = \text{sign}(x_c - x)\left[P_{Co}\frac{1-x}{1-x+x/r} - P_{Gd}\frac{x}{x+(1-x)r}\right]$$

where $P_{Co}$ and $P_{Gd}$ are the polarization of the current from pure Co and Gd, respectively, $x_c$ is the compensation concentration (~0.21), and r is the ratio of the tunneling probability from the Co as compared to the Gd sites. Thus r>1 indicates that tunneling from Co is more probable than tunneling from Gd. This model can account well for the experimental TSP data of FIG. 4 (shown as a dashed curve) using fitting parameters of ~40% spin polarization for the Co atoms, ~13% for Gd and a tunneling rate for Co~1.5 times higher than for Gd.

The tunneling rate is strongly influenced by the electron effective mass. Since the effective mass $m_{eff}$ of the sp conductions bands is much lower for the transition metals ($m_{eff}$~1) than for the heavy rare-earth metals ($m_{eff}$~3-5) this could account for the higher tunneling rate from Co as compared to Gd. It is also clear from previous studies[45] of the dependence of tunneling spin polarization on the composition of Co—Pt alloys that bonding of the atoms in the magnetic alloy with oxygen in the tunnel barriers strongly influences the tunneling rate. For the case of Co—Pt, the tunneling rate from Co was concluded to be much higher than that from Pt (by a factor of ~3). This is consistent with the much stronger bonds formed between Co and oxygen as compared to those formed with Pt; Pt is a noble metal, forming only weak bonds with oxygen. For the case of Co—Gd, Gd is believed to be preferentially oxidized. This was reported for Co—Gd alloys[33,41,42] as well as for compositionally modulated Co/Gd multilayers[46]. Similar results were obtained for other RE—TM alloys such as Fe—Tb[47,48] and Co—Fe—Tb[49]. Thus the relative tunneling rates from Co and Gd will be influenced by both effective mass effects as well as bonding. Since fitting the dependence of TSP on Gd composition gives a higher tunneling rate for Co than for Gd, this suggests that even though the Gd is more likely to be oxidized than Co, the tunneling current is nevertheless dominated by electrons tunneling from Co.

The data in FIG. 4 shows that the TSP for Co—Gd alloys becomes negative at ~20 atomic % Gd and remains negative until the Gd concentration reaches ~80 atom %. For higher Gd content the TSP is positive. This can be readily understood within the framework of the above model. Since the polarization from Gd is much smaller than that from Co, the polarization from the Co sub-network is dominant for nearly the whole Co—Gd composition range. However, eventually for a sufficiently high Gd content, the Gd sub-network dominates the polarization of the tunneling current. For Co—Gd the positively polarized tunneling current from Gd exceeds that of the negatively polarized tunneling current from Co at ~80 atomic % Gd.

The negative TSP observed for Co—Gd alloys is thus a consequence of the anti-parallel alignment of the RE and TM sub-network moments, similar tunneling probabilities from the RE and TM atoms, and a high spin polarization for tunneling from TM atoms compared to RE atoms. Since these characteristics also apply to other heavy RE—TM alloys, negative TSP can be expected for alloys of Co, Fe, and Ni with the heavy RE elements from Gd to Yb. The exact composition range for which the TSP is negative will depend on these various factors. The realization of large negative TSP values of up to −30% is due to the fact that the RE magnetic moment is much higher than that of Co. In pure Gd the atomic moment is ~7.5 $\mu_B$, while it is only ~1.7 $\mu_B$ for Co; hence for relatively low Gd concentrations, the Co sub-network magnetization is oriented anti-parallel to the applied field.

Figure 1:
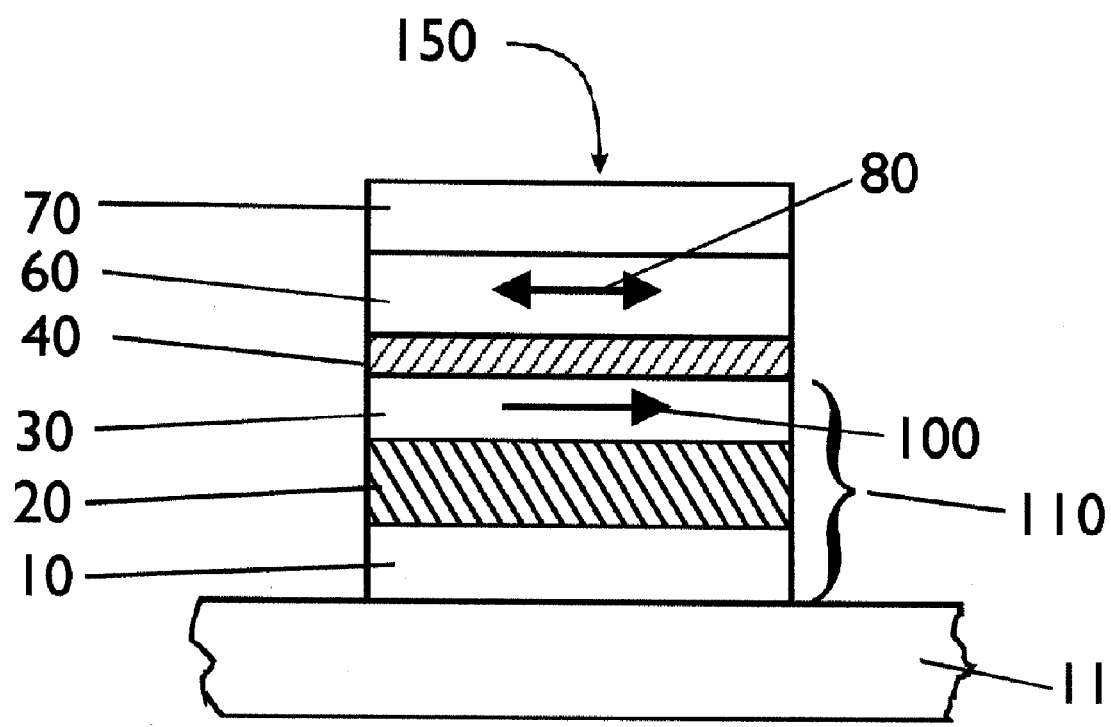
FIG. 1 shows a schematic of a magnetic tunnel junctions formed in accordance with the prior art.
Figure 2:
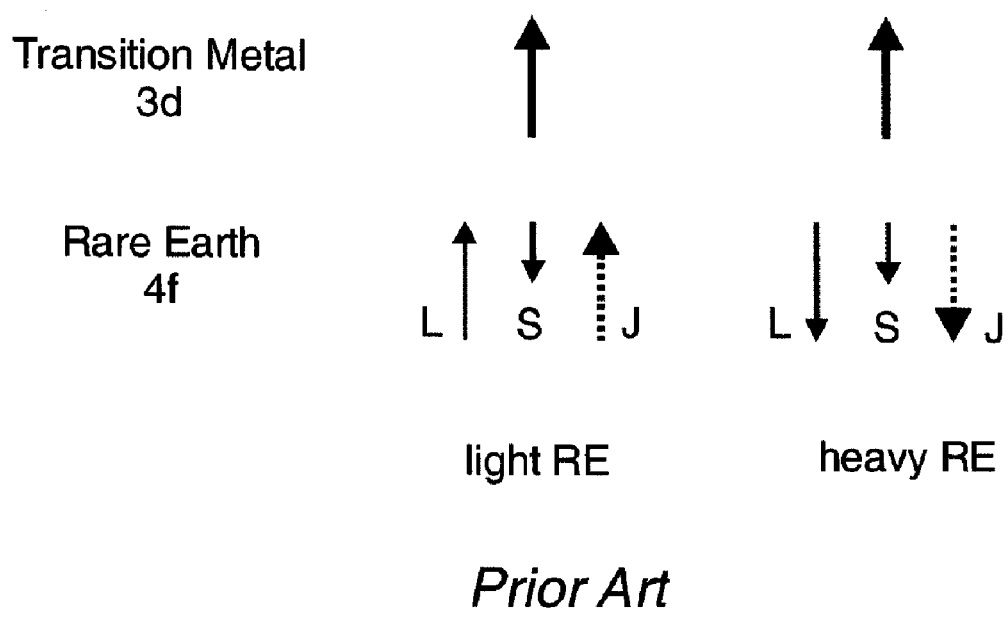
FIG. 2 is a schematic of the relative orientation of spin (S), orbital (L), and total (J) moments on transition metal and rare earth atoms in alloys formed from transition metals and light and heavy rare earth metals, respectively.
Figure 3:
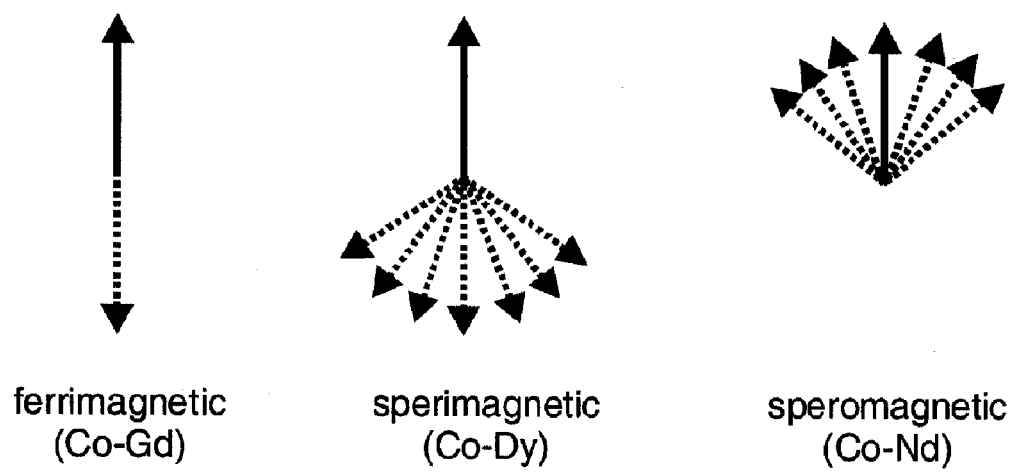
FIG. 3 illustrates the relative orientation of magnetic moments in Co—Gd, Co—Dy, and Co—Nd alloys.

The TSP of various Co—Tb and Fe—Tb alloys was also measured using n-FIS structures (see Table 1). The TSP was positive for low Tb concentrations, changing sign and becoming negative for Tb concentrations above ~14 atomic % Tb, the compensation concentration. This is a lower RE fraction as compared to Gd based alloys because of the higher magnetic moment of Tb. For Co—Tb and Fe—Tb alloys, the situation is further complicated as both the Fe and Tb sub-network moments form speri-magnetic arrangements (i.e., the moment directions are not collinear, as illustrated in FIG. 3). However, the dependence of TSP on Fe—Tb composition is similar to that of Co—Gd alloys and a similar explanation holds. However, the collinear spin structure of Co—Gd as well as the low coercivity of these alloys makes Co—Gd more attractive.

TABLE 1

TSP for Tb and various Co—Tb, Fe—Tb alloys

| Material | TSP |
| --- | --- |
| $Co_{80}Tb_{20}$ | +14% |
| $Co_{75}Tb_{25}$ | −13% |
| $Co_{58}Tb_{42}$ | −15% |
| $Co_{20}Tb_{80}$ | +1% |
| $Fe_{92}Tb_{8}$ | +25% |
| $Fe_{58}Tb_{42}$ | −11% |
| $Fe_{40}Tb_{60}$ | −4% |
| $Fe_{20}Tb_{80}$ | +3% |
| Tb | +2.5% |

An important and useful property of RE—TM alloys is their much lower saturation magnetization values compared to the TMs or their alloys. Moreover, as described herein, the saturation magnetization of RE—TM alloys can be tuned to a desired value by adjusting the composition of the alloy. For many applications it is beneficial to use magnetic materials with low saturation magnetization values, since this reduces the magnitude of magnetostatic fields which can otherwise be detrimental to the operation of these devices. Because of the difficulty in controlling the thicknesses of ultra thin magnetic layers, it may also be useful to use thicker layers of lower magnetization materials for otherwise the same (or lower) magnetostatic fields. The processing of such devices with thicker magnetic layers may also be easier. RE—TM alloys are extremely advantageous in these respects because their magnetization is very sensitive to the alloy composition and can be tuned to be essentially zero at the compensation composition, while at the same time the TSP is largely insensitive to composition for high TM fractions and, moreover, can be changed in sign from positive to negative.

The use of materials which display negative TSP in combination with materials which display positive TSP can give rise to useful device structures as discussed below in more detail. However, an important prerequisite of the use of such materials (for example, as the magnetic electrodes in MTJ memory elements) is that they show sufficiently low coercivity and magnetic anisotropy fields.

The dependence of coercivity and magnetic anisotropy on composition for Co—Gd and Co—Fe—Gd thin films was studied in detail. The films were sputter deposited using DC magnetron sputtering from Co—Gd and Co—Fe—Gd targets, respectively, at sputter powers of ~80 W and argon gas pressures of ~3 mTorr. Permanent magnets close to the substrate during deposition provide a ~100 Oe strong magnetic field in the film plane.

Figure 8:
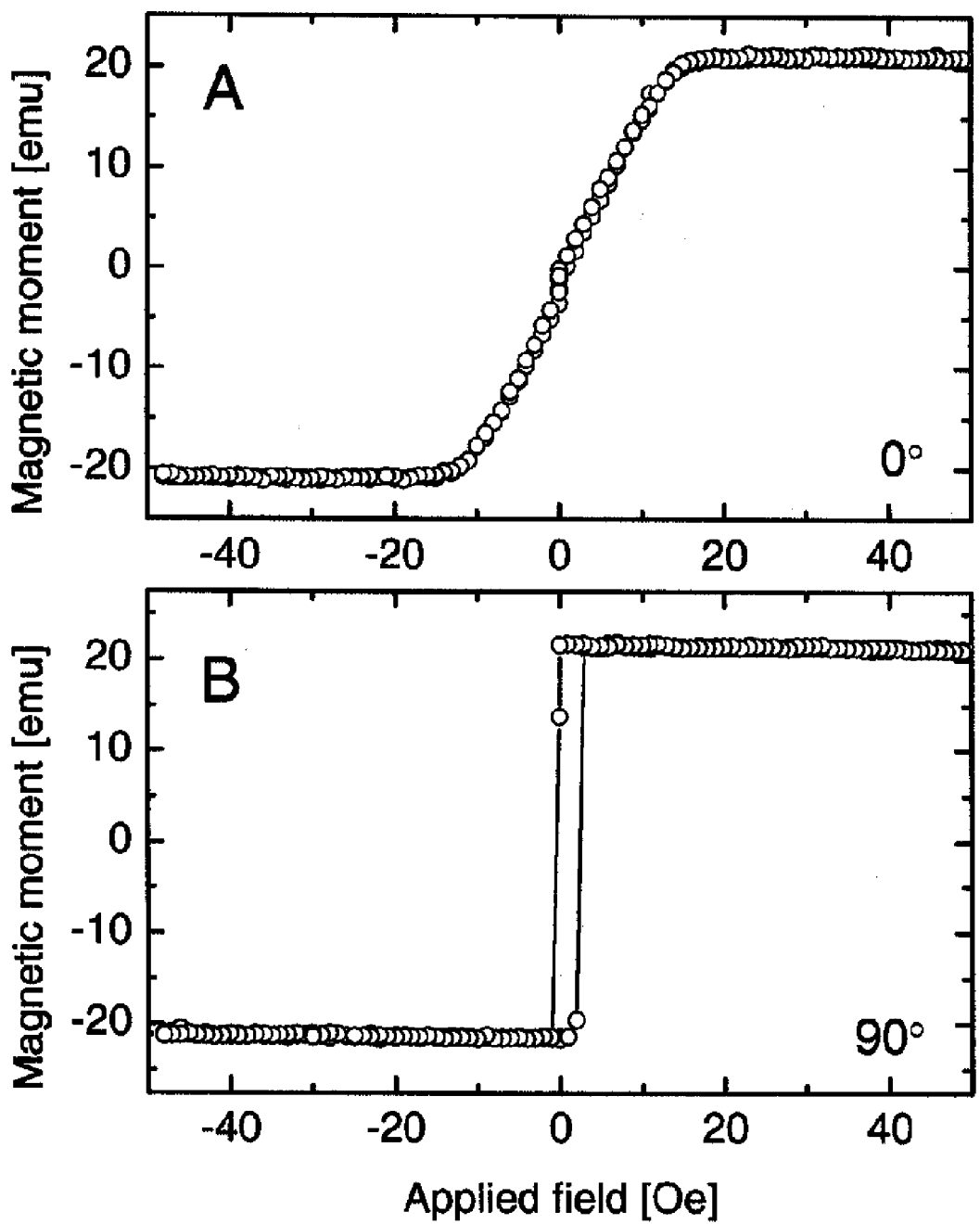
FIG. 8, which includes

Although Co—Fe—Gd alloys can exhibit perpendicular anisotropy, all films were found to exhibit uniaxial anisotropy with the easy axis in the film plane. FIG. 8 shows two representative magnetic hysteresis loops measured at room temperature with a vibrating sample magnetometer on a 500 Å thick $Co_{65}Gd_{35}$ layer sandwiched between two 100 Å thick Ta layers (to prevent oxidation). The loops are taken with the field aligned along two orthogonal directions in the film plane, corresponding to the easy and hard anisotropy directions. Along the easy direction the magnetization curve shows a square hysteresis loop with nearly 100% remanent magnetization in zero field, while along the orthogonal direction, the second loop shows behavior characteristic of a hard axis with an $H_k$ of ~15 Oe. The easy axis of magnetization was determined to be parallel to the field applied during deposition.

Similar measurements were performed for a variety of Co—Gd and Co—Fe—Gd alloys with varying Gd concentration. FIGS. 9A, 9B, 9C, and 9D show, respectively, a summary of the saturation magnetization ($M_s$), coercivity ($H_c$), anisotropy field ($H_k$), and anisotropy constant ($K_u$) for these films (at room temperature). The anisotropy constant $K_u$ was determined from $H_k$ and the magnetization $M_s$ using the formula $K_u = \frac{1}{2} H_k M_s$. The large error bars in the saturation magnetization data are due to errors in film thickness determination and, most importantly, errors in measurements of the magnetic moment of the film. The latter were carried out with a vibrating sample magnetometer (VSM) which, because of the sensitivity of the filling factor of the pick-up coil fillings to the exact position of the sample in these coils, can give rise to large errors in absolute moment.

The anisotropy field is strongly increased for Gd concentrations close to the compensation point. Although both $M_s$, which vanishes at the compensation point, and $H_k$, which diverges at the compensation point, depend strongly on the Co—Gd composition, the anisotropy constant $K_u$, which is proportional to the product of both $M_s$ and $H_k$, remains finite and varies only slowly with composition. The anisotropy field and anisotropy constant are much higher for Co—Fe—Gd alloys than for Co—Gd alloys. These results are similar to the dependence of $K_u$ on Gd concentration in Co—Fe—Gd alloys with perpendicular anisotropy[26].

Figure 9:
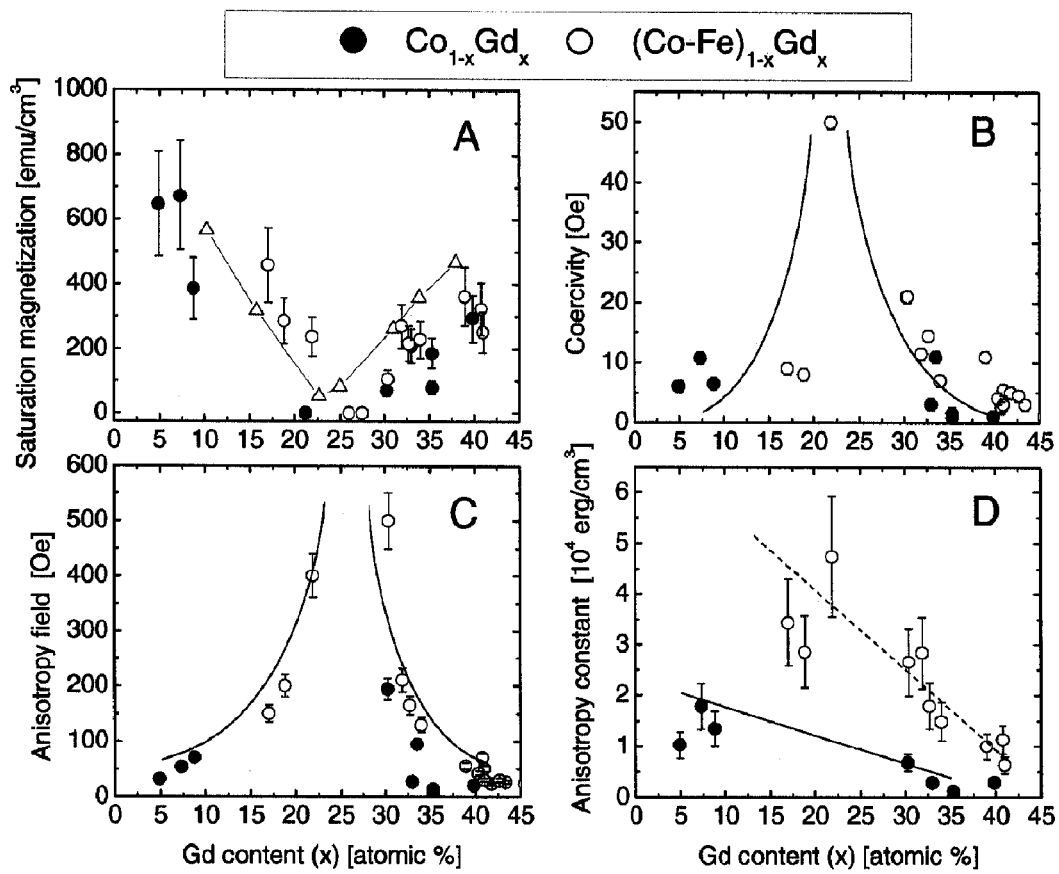
FIG. 9, which includes
Figure 10:
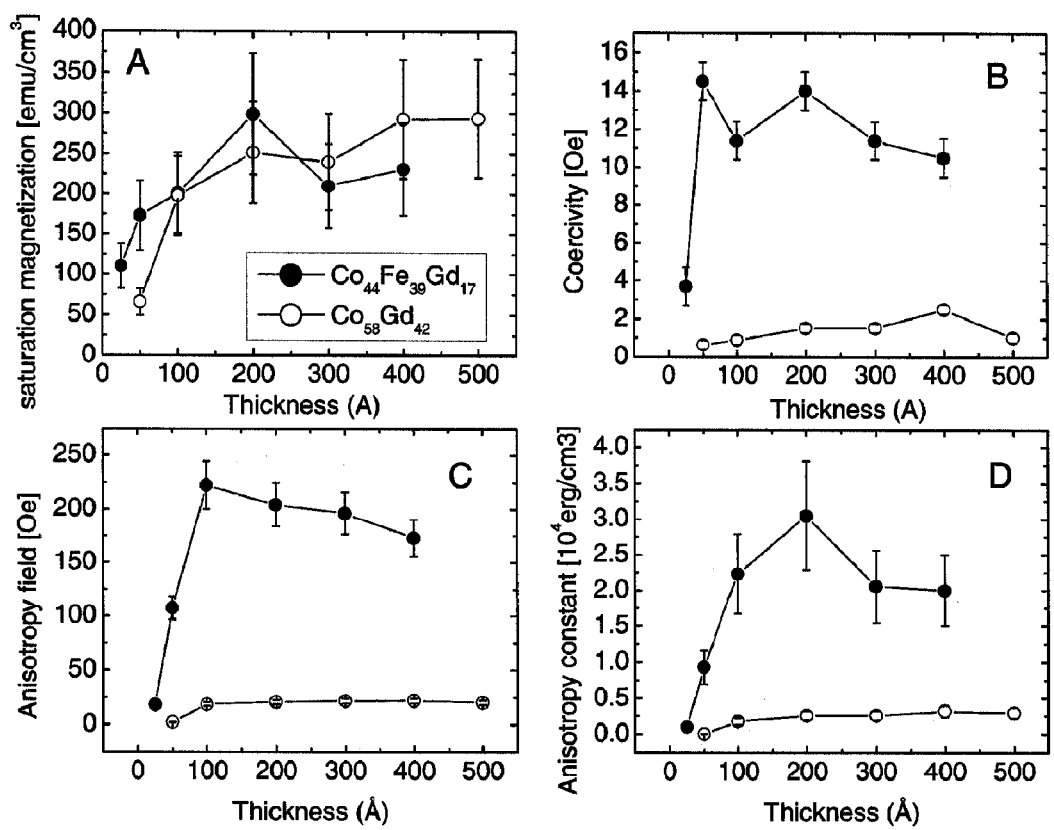
FIG. 10, which includes
Figure 11:
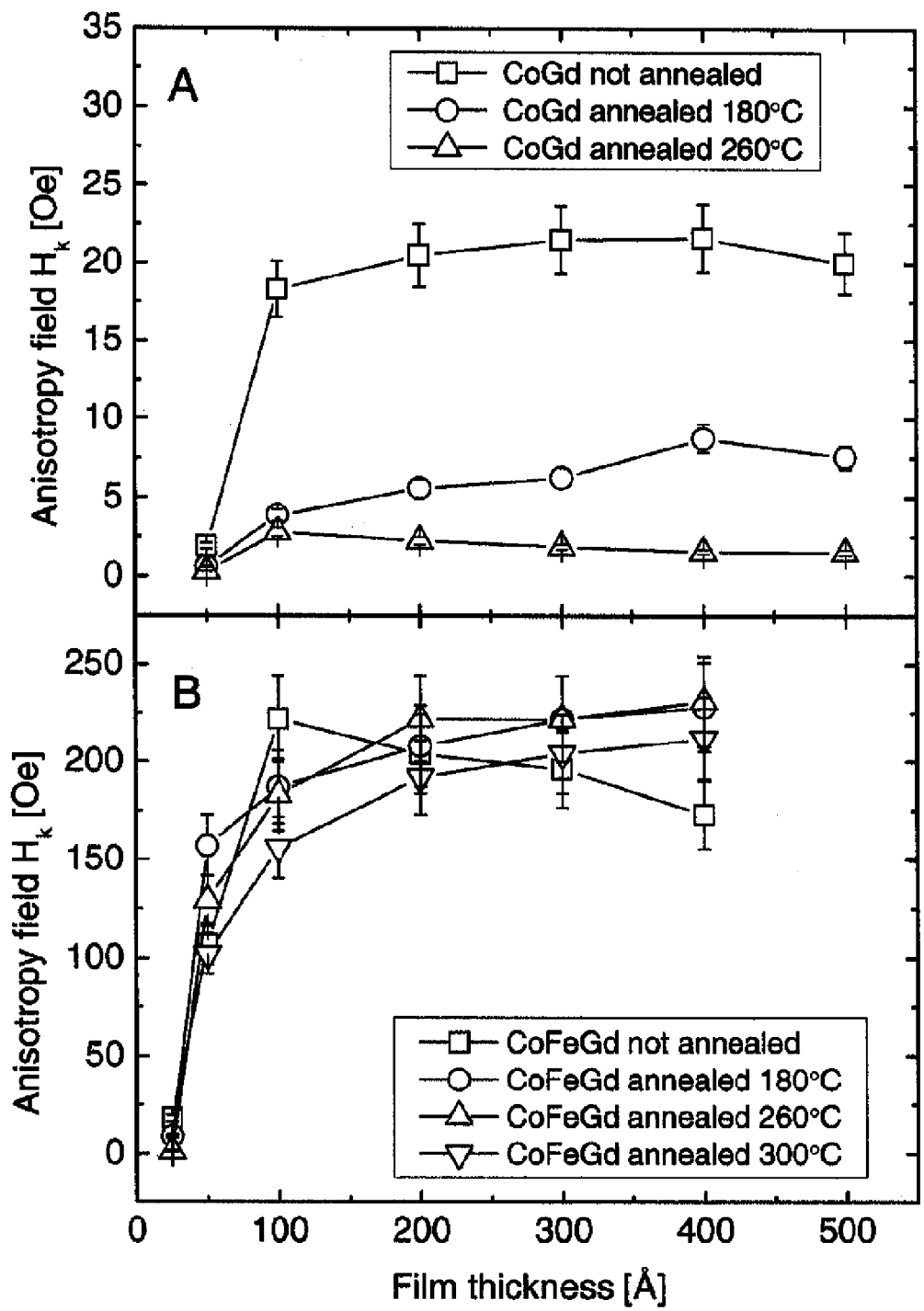
FIG. 11, which includes

The results in FIG. 9 correspond to measurements on ~500 Å thick RE—TM films. In MRAM MTJs, useful layer thicknesses would likely be much lower to reduce the net magnetic moment and thus the associated dipolar magnetic fields. The influence of layer thickness on $H_k$ and $K_u$ was studied for two different alloy compositions ($Co_{44}Fe_{38}Gd_{18}$ and $Co_{58}Gd_{42}$) for layer thicknesses ranging from 25 to 500 Å. The results are shown in FIG. 10. The anisotropy field and constant are much higher for Co—Fe—Gd as compared to Co—Gd samples for thickness range studied. Pronounced decreases in both $H_k$ and $K_u$ as well as magnetization for thicknesses below 100 Å are observed in both material systems. The decrease in anisotropy constant can be related to the decrease of the magnetization due to finite size effects[50,51] for films thinner than 100 Å. Above 100 Å, both $H_k$ and $K_u$ are relatively insensitive to thickness. 90 The dependence of the anisotropy on annealing was also investigated (see FIG. 11) because of its importance for MRAM, where MTJs are subjected to elevated temperatures during processing. The films were annealed (the samples herein were typically annealed for 30 minutes or longer) at various temperatures in a vacuum annealing furnace at <$10^{-7}$ Torr in an applied field of 1 T. Hard and easy axis loops were measured in a VSM. For some samples the angular remanence was also measured. Here the angle of the sample with respect to the magnet and pickup coils was varied in small increments up to a full revolution. At each angle, the film is saturated with an applied magnetic field of 1000 Oe, then the magnetic field is removed, and the remanent moment is measured. Samples with uniaxial anisotropy should show a characteristic pattern with a 180° period, whereas samples with higher order anisotropies would show more complex angular dependencies: for example, for a sample with cubic anisotropy, the remanent moment would show a 90° period.

The annealing studies show that the magnetization of the samples is hardly affected by annealing up to ~320° C. However, the anisotropy field shows a pronounced change upon annealing. For the thickest Co—Fe—Gd samples, $H_k$ increases slightly after annealing at 180° C. but then stays constant upon further annealing. By contrast, for the Co—Gd samples, $H_k$ is decreased after each annealing step and after annealing at 260° C., the anisotropy field is reduced to below 2 Oe.

Figure 12:
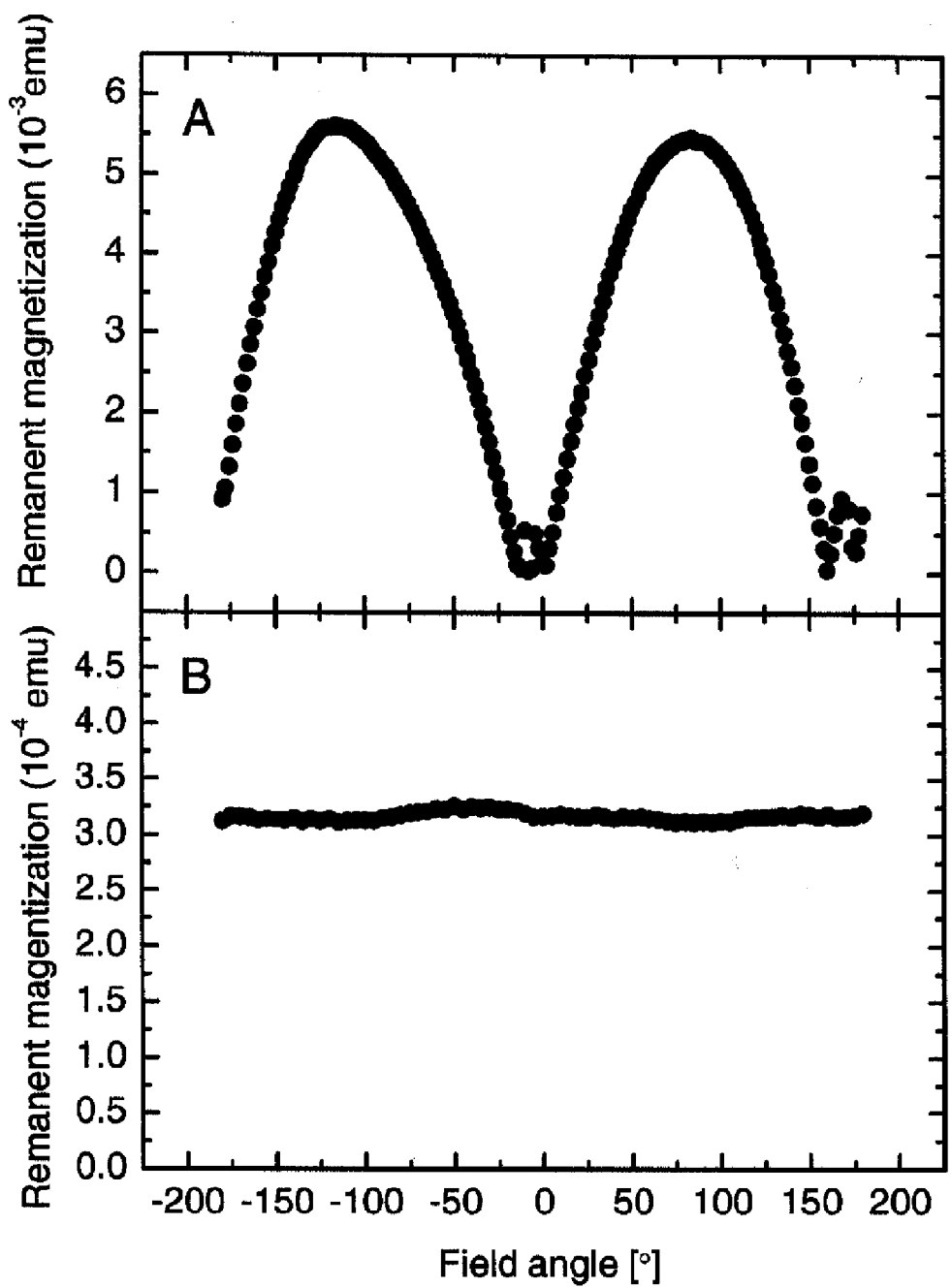
FIG. 12, which includes

However, after annealing at 300° C., a distinctly different behavior is observed. The hard and easy axis can no longer be clearly distinguished, and the film is nearly isotropic in the film plane. This is readily observed in angular remanence scans. FIGS. 12A and 12B show the angular dependence of the remanent magnetization for the 500 Å thick Co—Gd film after annealing at 260° C. and 300° C., respectively. The shapes of these curves are dramatically different. The uniaxial anisotropy is absent after the high temperature anneal. These data are consistent with crystallization of the sample which is amorphous as deposited and which remains amorphous for anneal temperatures up to at least 260° C. Indeed, the crystallization temperature for $Co_{50}Gd_{50}$ is known to be ~300° C.[52]. The angular remanence curve after the anneal at 300° C. becomes characteristic of a polycrystalline sample with randomly oriented crystalline grains, each with its own anisotropy direction.

The fact that the anisotropy field decreases with increased annealing temperature is consistent with a mechanism in which the uniaxial anisotropy in these systems is derived from anisotropic short range order, as this order would likely be diminished with thermal treatments. The easy axis is oriented parallel with the field applied during deposition. Although this field is small (~100 Oe), it will likely orient the magnetization of the initially deposited magnetic material and then the much larger internal exchange fields will likely induce an anisotropic local chemical structure.

The data show that for moderate anneals up to 260° C. Gd rich Co—Gd alloys show very low coercivity (<5 Oe) and anisotropy fields (<5 Oe) making them candidates for storage magnetic layers in MRAM MTJ memory cells. If necessary, the crystallization temperature could likely be increased, for example, by adding glass forming elements such as boron, silicon, zirconium, or hafnium. An increase of the crystallization temperature can also be achieved via the substitution of Co with Fe. The replacement of Fe for Co has little influence on the anisotropy field except for Gd concentrations close to the compensation point, when changing Fe for Co will result in a compensation point at a higher Gd content due to the higher Fe moment: the coercivity is significantly increased for Gd concentrations close to the compensation point where the magnetization is nearly zero. For Gd concentrations higher than the compensation point concentration, the magnetic properties are insensitive to the ratio of Co to Fe for the same Gd concentration. Thus the properties of the RE—TM alloy can be engineered with respect to magnetization, magnetic anisotropy and crystallization temperature by varying the composition of the TM alloy component (which may be advantageously formed from a combination of one more of Co, Fe and Ni), by varying the ratio of the TM component to the RE component, and/or by adding other components to the alloy such as suitable glass forming components.

Figure 13:
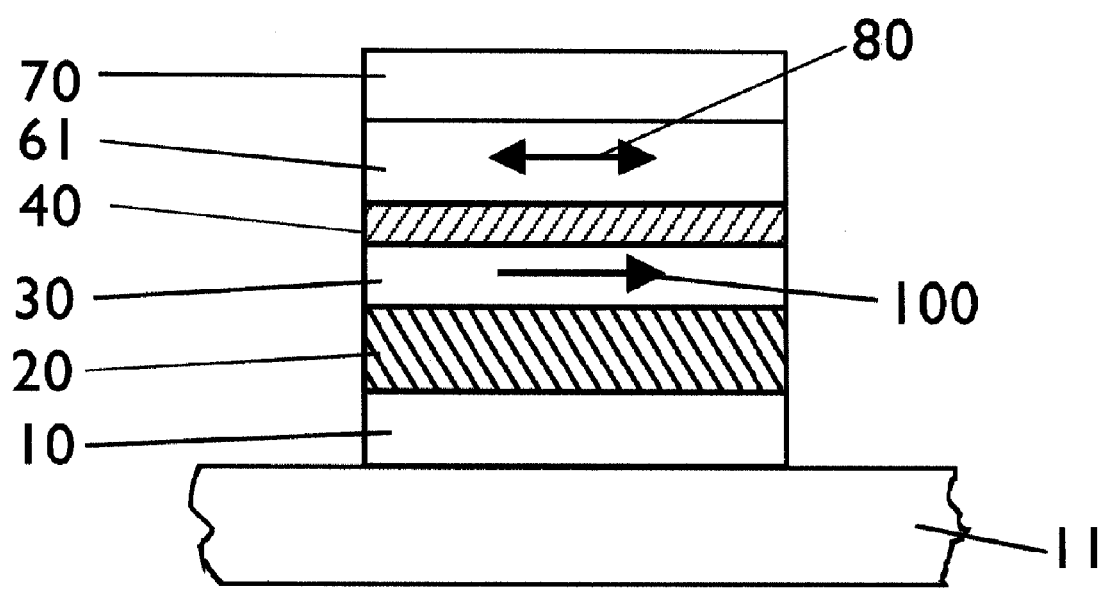
FIG. 13 is a cross sectional view of a magnetic tunnel junction of the present invention.

The spin polarization measurements are carried out at low temperatures, but the spin polarization can be measured at higher temperatures by measuring the tunneling magnetoresistance of magnetic tunnel junctions which incorporate RE—TM alloys in the magnetic electrodes. These studies show that the RE—TM alloys exhibit negative spin polarization even at room temperature. For example, FIG. 13 shows an exchange biased MTJ in which the free layer is formed from a RE—TM alloy. The MTJ structure is prepared on a substrate 11, with a seed layer 10 which allows suitable growth of the multilayer stack. Layer 30 is the bottom magnetic electrode whose magnetization is fixed along the direction indicated by the arrow 100 by exchange biasing with an antiferromagnetic layer 20. The counter electrode 61 is formed from a RE—TM alloy whose magnetization can be set in a direction parallel or anti-parallel to that of the fixed reference layer as indicated by the arrow 80. The tunnel barrier and capping layer are indicated by reference numerals 40 and 70, respectively.

Figure 14:
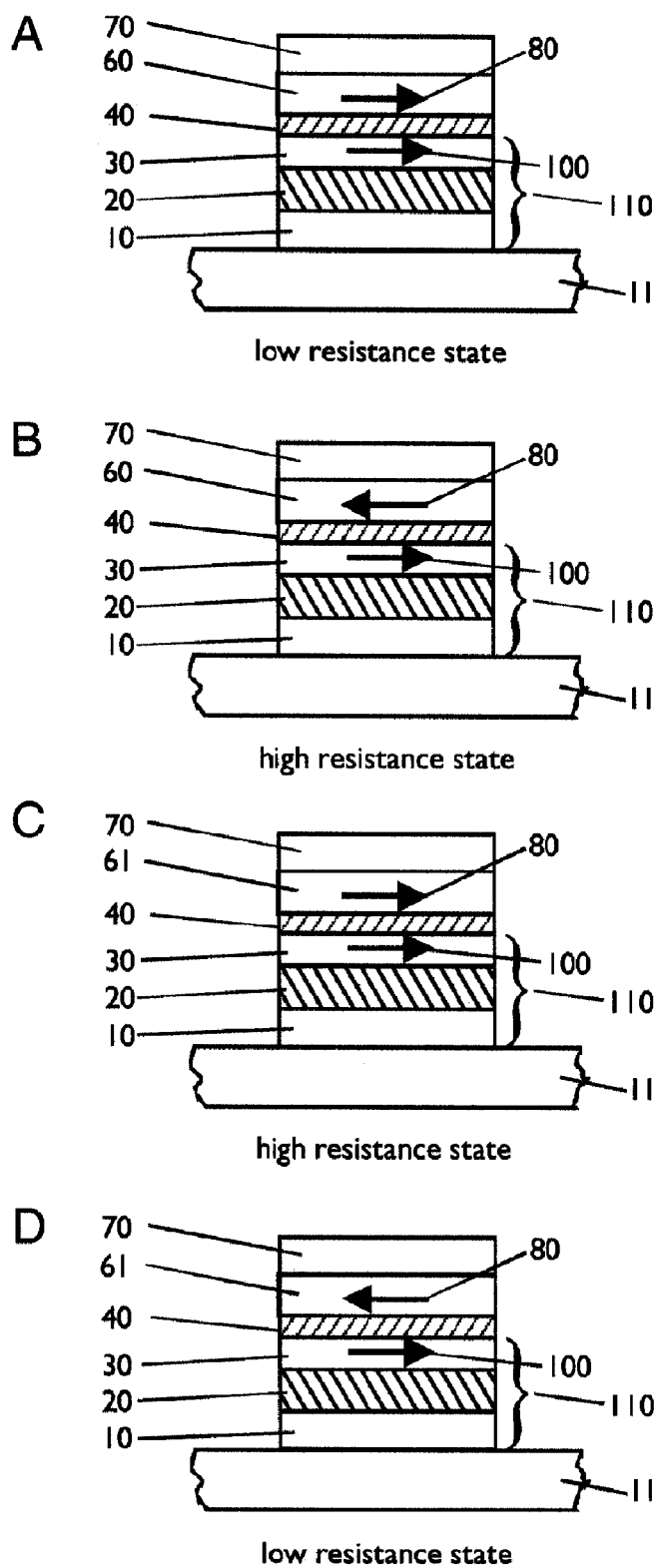
FIG. 14, which includes

If one of the magnetic layers has a negative TSP while the other has a positive TSP then the TMR will be also be negative, according to Julliere's model. This means that the MTJ is in the low resistance state if the magnetizations of both layers are aligned anti-parallel while it is in the high resistance state for parallel alignment. This behavior is illustrated in FIG. 14 where the resistance states for MTJs with a positively polarized (layer 60 in FIGS. 14A and 14B) and a negatively polarized top magnet (layer 61 in FIGS. 14C and 14D) are shown (the bottom magnetic layer 30 is positively polarized in each case). In order to be able to compare the TMR values of structures with either positive or negative TMR, a modified TMR definition for negative TMR values is useful:

$$TMR_{neg} = \frac{R_{AP} - R_P}{R_{AP}}$$
$$= \frac{2P_1 P_2}{1 + P_1 P_2}$$

Here the denominator represents the low resistance state. This definition will be used in the following whenever either $P_1$ or $P_2$ (but not both) are negative. The above formula allows for the determination of the spin polarization of one of the electrodes by measuring the TMR if the TSP of the counter electrode is known.

The TMR for MTJs having the following structure was measured:

100 Å Ta/250 Å $Ir_{78}Mn_{22}$/35 Å $Co_{70}Fe_{30}$/23 Å MgO/x Å Co—Gd/100 Å Ta

For the top electrodes, three different Co—Gd compositions were used: $Co_{91}Gd_9$, $Co_{74}Gd_{26}$, and $Co_{40}Gd_{60}$. The thickness of the Co—Gd layer was varied in the case of $Co_{74}Gd_{26}$ from 25 Å to 500 Å. For the other compositions, the Co—Gd layer thickness was kept fixed at 300 Å. The compositions correspond to the case where the TSP was measured to be positive ($Co_{91}Gd_9$) and negative ($Co_{74}Gd_{26}$ and $Co_{40}Gd_{60}$). Since the Gd and Co sub-network magnetizations have different temperature dependencies, one expects to see a crossover from Gd-dominated magnetization at lower temperatures to Co-dominated magnetization in $Co_{74}Gd_{26}$ at the compensation temperature[16,23]. For $Co_{40}Gd_{60}$, the Curie temperature is below the compensation temperature; thus the magnetization is dominated by the Gd sub-network for all temperatures up to the Curie temperature.

Figure 15:
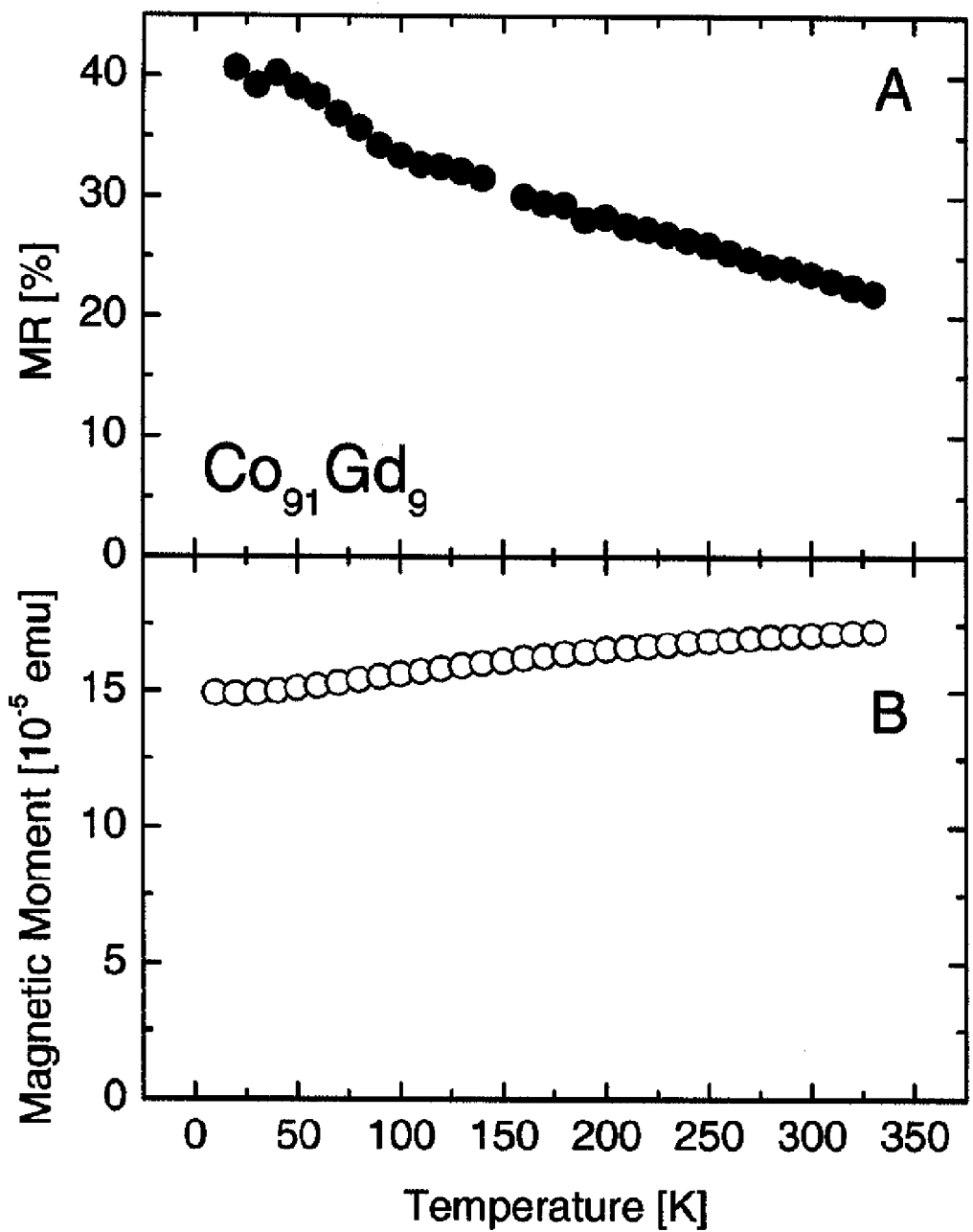
FIG. 15, which includes

The TMR for the sample with a 300 Å thick $Co_{91}Gd_9$ top electrode is positive for all temperatures up to 330 K, as shown in FIG. 15A. The decrease of the TMR with temperature is typical for MTJs and is believed to be due to inelastic scattering processes due to the excitation of spin waves[53-55]. Here the TMR falls more quickly with increasing temperature than for MTJs with both electrodes formed from TMs. In FIG. 15B the temperature dependence of the saturation magnetic moment of the free and capping layer is shown. This was measured with a SQUID magnetometer by separately measuring the saturation magnetization of the complete MTJ stack (including both bottom and top magnetic electrodes) and the bottom electrode of the MTJ stack, respectively, and then subtracting these signals. (These samples are of size ~2 mm×6 mm and are deposited on the same wafer as the shadow masked tunnel junctions.) The saturation magnetization was measured in an in-plane applied field of 0.5 T. The magnetization increases slightly with temperature, reflecting the strong Co—Co exchange and correspondingly high Curie temperature and the more pronounced reduction in magnetization of the Gd sub-network (which is antiparallel to that of the Co sub-network). For this Co—Gd composition the Curie temperature is well above room temperature and not accessible with the SQUID magnetometer.

Figure 16:
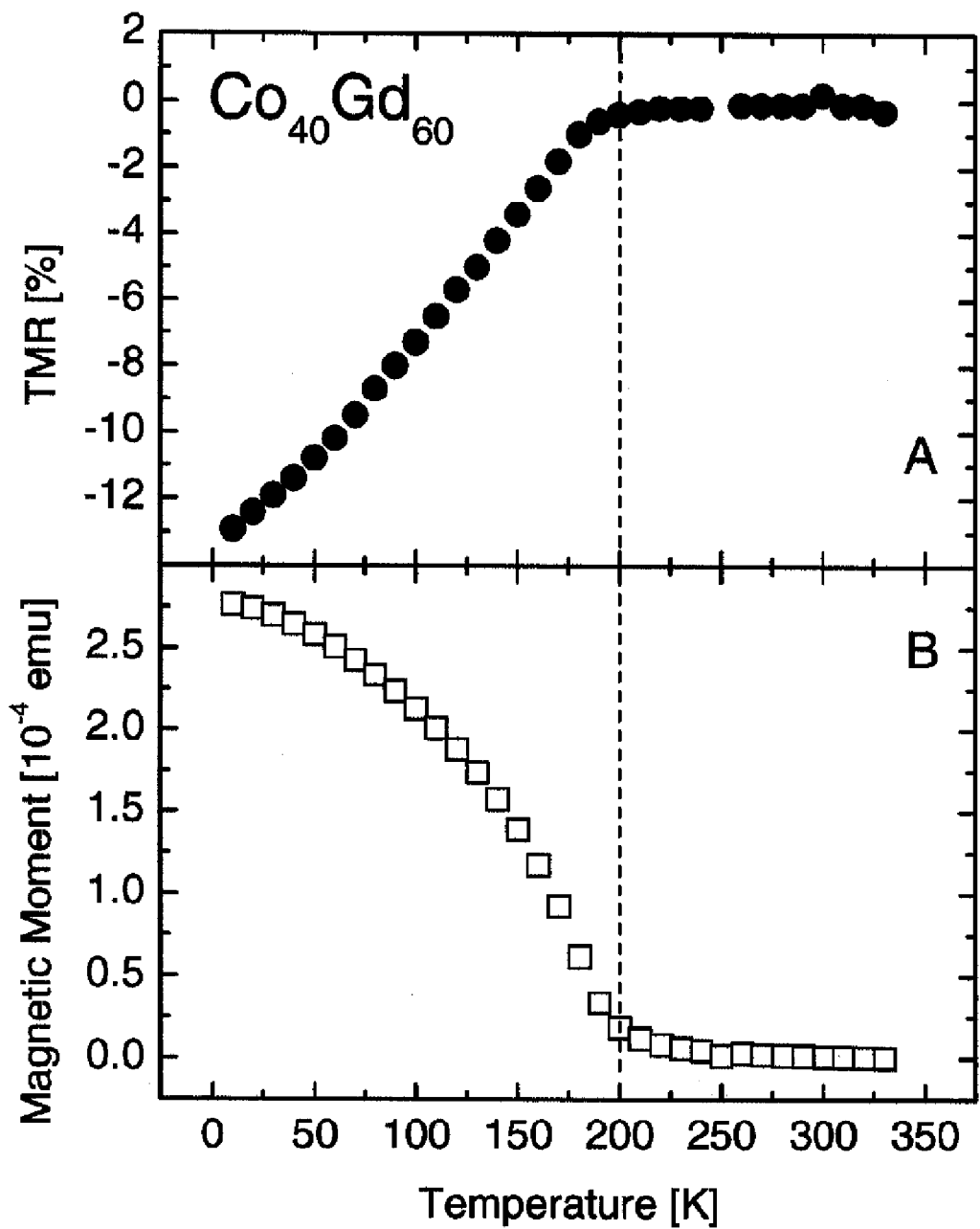
FIG. 16, which includes

For $Co_{40}Gd_{60}$ the results are very different, as shown in FIG. 16: the TMR is negative and vanishes at around 200 K. This temperature corresponds to the Curie temperature of the Co—Gd alloy as can be seen from the magnetization that vanishes at the same temperature (FIG. 16B). The negative TMR shown in FIG. 16A is consistent with the negative TSP measured for $Co_{40}Gd_{60}$. Since the Gd moment dominates over the whole temperature range, no positive TMR is found at any temperature. The Curie temperature is reduced even below the $T_C$ of pure Gd (~300 K) due to the fact that the Co—Gd exchange is much weaker than either the Co—Co and Gd—Gd exchange.

Figure 17:
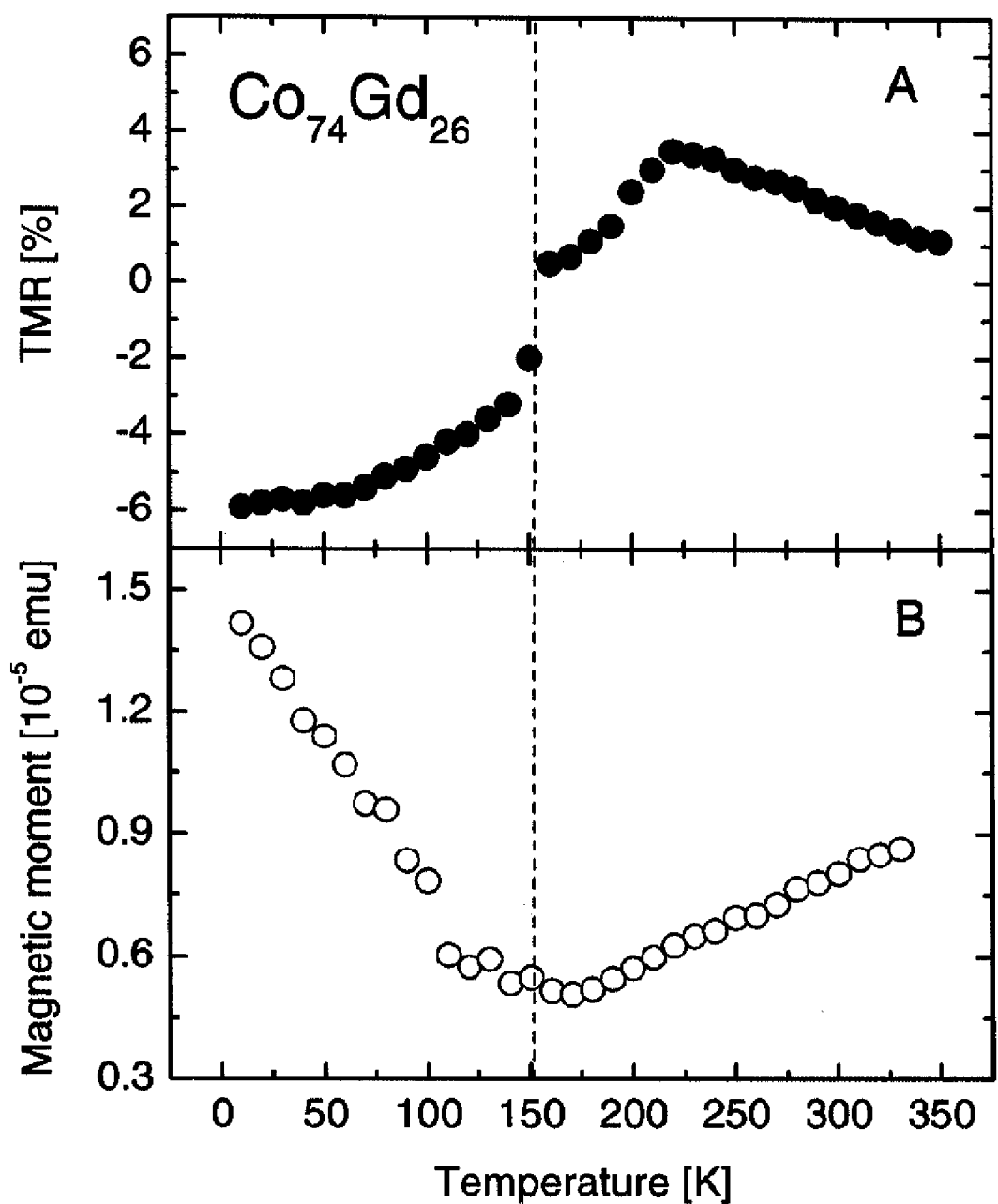
FIG. 17, which includes

By contrast, MTJs with $Co_{75}Gd_{25}$ electrodes show both positive and negative MR depending on the temperature, as illustrated in FIG. 17 for a sample with a 50 Å thick $Co_{75}Gd_{25}$ electrode. The transport measurements indicate a compensation temperature around 150 K where the TMR changes sign. At the compensation temperature, the relative orientation of the Co and Gd sub-network moments reverses with respect to the applied field. The compensation temperature can also be inferred from the minimum in the magnetization in FIG. 17B. The compensation point determined from both the transport and magnetization measurement is the same (~150 K).

In summary, MTJs with one electrode formed from a CoFe TM alloy and the counter electrode formed from a Co—Gd RE—TM alloy display at room temperature both positive and negative TMR values dependent on the composition of the RE—TM alloy and whether or not the RE or TM sub-network magnetization is the dominant magnetization. Moreover, the sign of the TMR can be varied for the same RE—TM alloy by varying the temperature since the temperature dependence of the RE and TM sub-network magnetization is different. By choosing a RE—TM alloy and composition with a compensation temperature above room temperature, the sign of the TMR can be inverted by simply increasing the device temperature, which may be useful for certain applications. Furthermore, the magnetization of the RE—TM layer can be tuned over a wide range by changing the composition and can be made very small at the compensation point of the alloy system. However, the tunneling spin polarization can remain very high, thereby allowing for magnetic alloys with very small magnetization values yet high tunneling spin polarization. Such alloys could, for example, be very important for MTJ devices in which a current passing through the device is used to switch the magnetic state of the device using the phenomenon of spin torque. While the magneto-transport properties of RE—TM alloys have been described with respect to the Co—Gd alloy system, similar properties will be displayed by alloys of other heavy rare-earths and transition metals.

While MTJs and other spin-dependent tunneling devices incorporating RE—TM alloys have fascinating magneto-transport properties not yet observed in other material systems, these properties can be further improved. In particular, the maximum negative TMR observed at low temperatures is around −15% and only a few % at room temperature. These values are low compared to conventional MTJs with two Co—Fe electrodes and MgO or $Al_2O_3$ barriers (e.g., using MgO barriers TMR values of up to 220% at room temperature can be achieved[56]). To take advantage of the negative TMR and low uniaxial anisotropy fields in devices, increased TMR values are desirable as is improved thermal stability.

Figure 18:
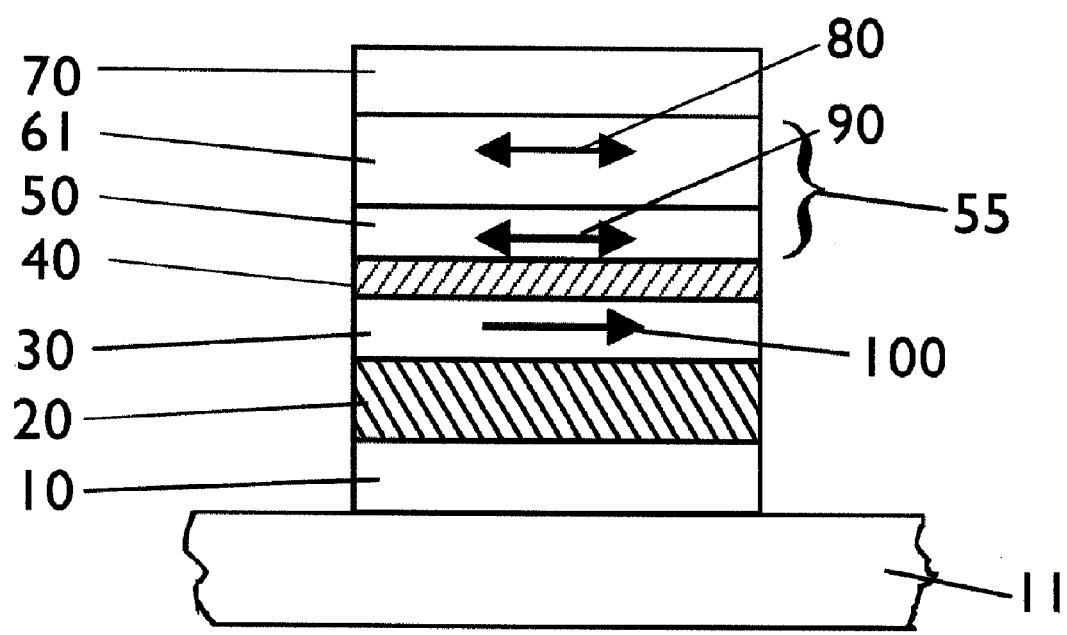
FIG. 18 is a cross sectional view of a magnetic tunnel junction of the present invention that employs a thin interlayer (layer 50) between the tunnel barrier (layer 40) and the free layer (layer 61).

An improved MTJ structure is shown in FIG. 18, which is similar to the structure of FIG. 13, but in which an additional layer 50 is inserted between the tunnel barrier 40 and the top (free) electrode 61. This interlayer is thin (e.g., 5-50 Å) and is a highly spin-polarized material that is strongly exchange coupled to the free layer 61, thereby allowing for high TMR values but retaining the coercivity and magnetic anisotropy of the RE—TM layer 61. Furthermore, the moment of the layer 50 is expected to couple parallel to the TM sub-network magnetization and anti-parallel to the RE sub-network magnetization. This behavior is found for Co, Fe and Ni and alloys of these transition metals. An exemplary material for the interlayer 50 is $Co_{70}Fe_{30}$, since it shows one of the highest spin polarization values (~53%) amongst the transition metals and their alloys. An exemplary structure of FIG. 18 is:

100 Å Ta/250 Å $Ir_{78}Mn_{22}$/35 Å $Co_{70}Fe_{30}$/23 Å MgO/x Å $Co_{70}Fe_{30}$/y Å Co—Fe—Gd/100 Å Ta where x and y denote the thicknesses of the interlayer 50 and the RE—TM layer 61, respectively. For the RE—TM layer, Co—Fe—Gd is used. One advantage of Co—Fe—Gd is that sputter targets formed from these alloys are less brittle than those formed from Co—Gd. The addition of Fe to Co—Gd can be used to modify the magnetic and structural properties of Co—Gd. The magneto-transport characteristics are similar for both Co—Gd and CoFe—Gd alloys since, in particular, the moment of the TM sub-network magnetization, whether comprised of Co or CoFe (or other TM alloys), is oriented anti-parallel to the Gd sub-network magnetization[19,23,26,57]. Whereas both the Co—Gd and Fe—Gd exchange is anti-ferromagnetic, the Co—Fe exchange is ferromagnetic.

FIG. 19B shows the dependence of TMR for MTJs of the structure of FIG. 18 on the thickness of the $Co_{70}Fe_{30}$ interlayer 50, as its thickness is varied from 0 Å to 75 Å. The Co—Fe—Gd layer 61, which is in each case 500 Å thick, has the nominal composition $Co_{35}Fe_{35}Gd_{30}$ which has a compensation temperature above room temperature. Without the interlayer 50 the TMR is about −6%, which is similar to MTJs with a Co—Gd free layer of comparable Gd composition. Increasing the interlayer thickness increases the negative TMR until it saturates at around −45% for an interlayer thickness >15 Å. This suggests that the polarization of the tunneling current is determined by an interface layer no thicker than ~15 Å. The TMR is insensitive to the thickness of the interlayer for thicker interlayers until a sudden jump to a positive 35% is found for a 75 Å thick $Co_{70}Fe_{30}$ layer.

Figure 19:
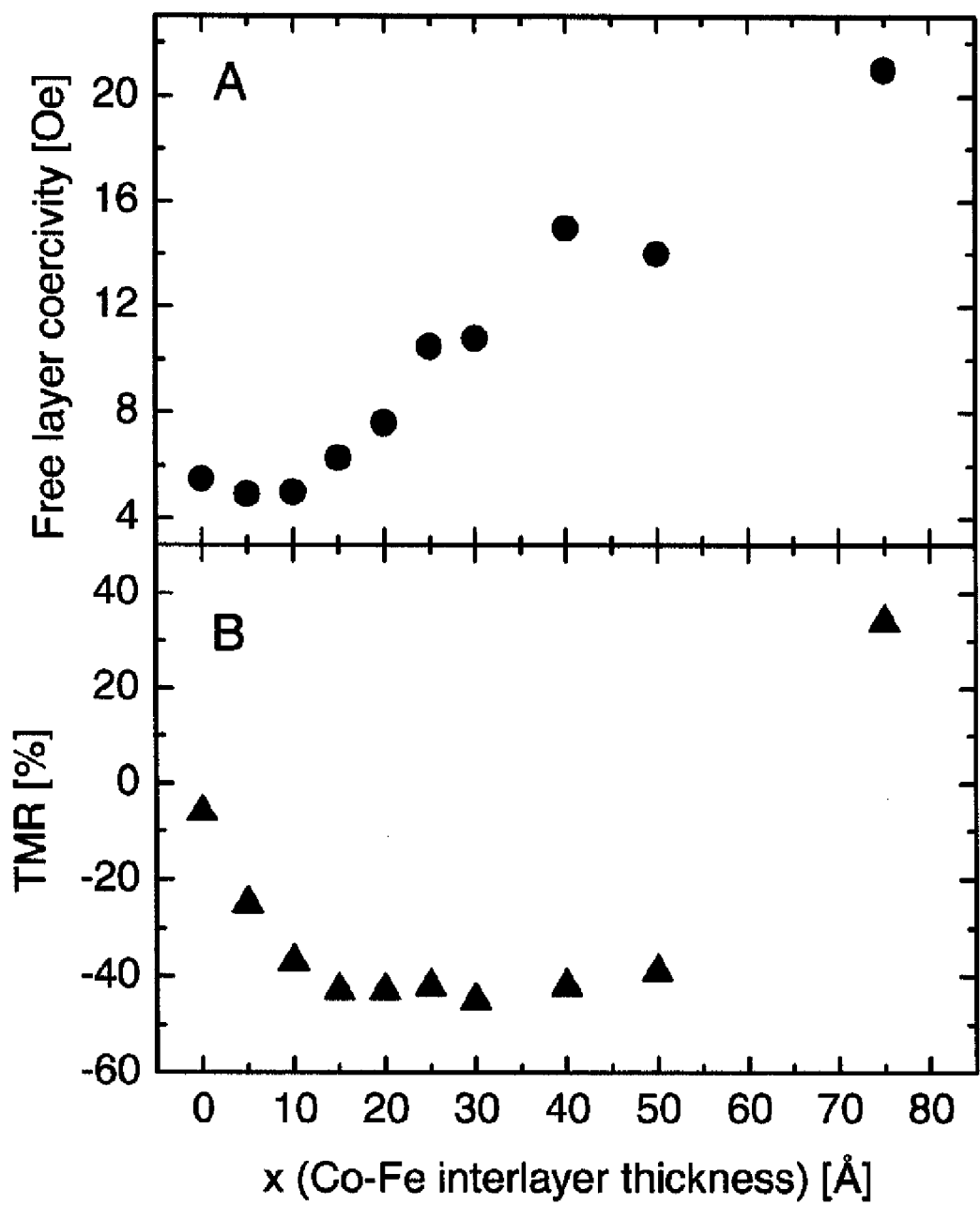
FIG. 19, which includes

The coercivity of the free layer, as determined from the TMR versus field minor loops, is shown in FIG. 19A. The coercivity is approximately constant for interface layer thicknesses up to ~10 Å but, with further increases in the interlayer thickness, increases monotonically from ~5 Oe to ~21 Oe. In contrast to the TMR which is determined by a thin interface layer region, the coercivity is a property of the entire free layer, i.e., the layer 50 of Co—Fe and the layer 61 of Co—Fe—Gd. This is because these layers are strongly exchange coupled and cannot switch independently. The coercivity is consequently determined by the relative proportion of RE to TM in the free layer as a whole. As the interlayer thickness is increased, the relative proportion of Gd in the free layer is decreased and the average composition is moved closer to the compensation point and thus the coercivity increases[58]. For a thick enough interlayer, the TM sub-network dominates and the TMR, moreover, becomes positive (as demonstrated in FIG. 19B where the TMR is positive for 75 Å Co—Fe). In summary, FIG. 19 shows a very useful property of the structure of FIG. 18: while the TMR maintains a high value (i.e., its absolute magnitude is high), the coercivity varies over a wide range. Moreover, the magnetization of the (entire) free layer can also be varied, thus allowing the engineering of the magnetic properties of the free layer for particular applications.

Figure 20:
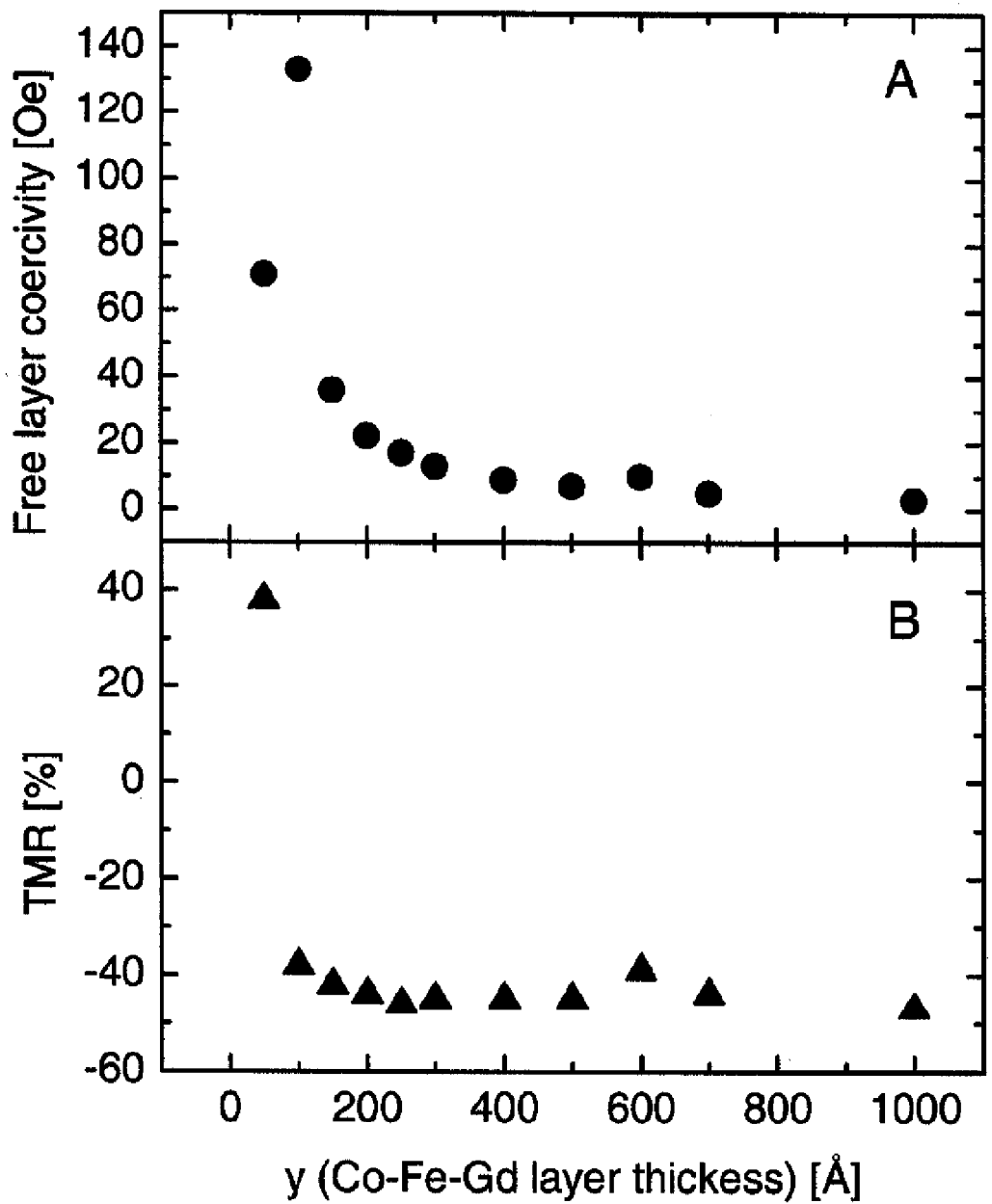
FIG. 20, which includes

FIG. 20 shows the TMR and free layer coercivity for samples having the structure 100 Å Ta/250 Å $Ir_{78}Mn_{22}$/35 Å $Co_{70}Fe_{30}$/23 Å MgO/15 Å $Co_{70}Fe_{30}$/y Å Co—Fe—Gd/100 Å Ta where the thickness of the interlayer 50 is fixed at 15 Å, and the Co—Fe—Gd layer 61 thickness is varied from 50 to 1000 Å. The properties of this structure can be understood by considering, to first order, what is the net composition of the entire free layer structure 55 (i.e., the combination of 50 and 61). At room temperature, the compensation point of the free layer 55 corresponds to a thickness of the CoFeGd layer 61 of between 50 and 100 Å for a CoFe interface layer thickness of ~15 Å. The coercivity and sign of TMR are dependent mainly on the relative proportion of RE to TM in the bilayer structure 55. (This only holds to first order as the relative amount of Co to Fe in the TM component will affect both the coercivity and the compensation temperature, which determines the sign of the TMR.) FIG. 20 shows that the coercivity of the free layer 55 decreases as the thickness of the RE—TM layer 61 is increased such that very low coercivities of just a few Oersteds are obtained for CoFeGd layer thicknesses above ~400 Å.

Upon annealing, the TMR and resistance typically increase up to a critical temperature, at which point the junction breaks down with loss of both resistance and TMR. While the insertion of a Co—Fe interlayer between the tunnel barrier and RE—TM electrode greatly increases the TMR, it also improves the thermal stability.

Figure 21:
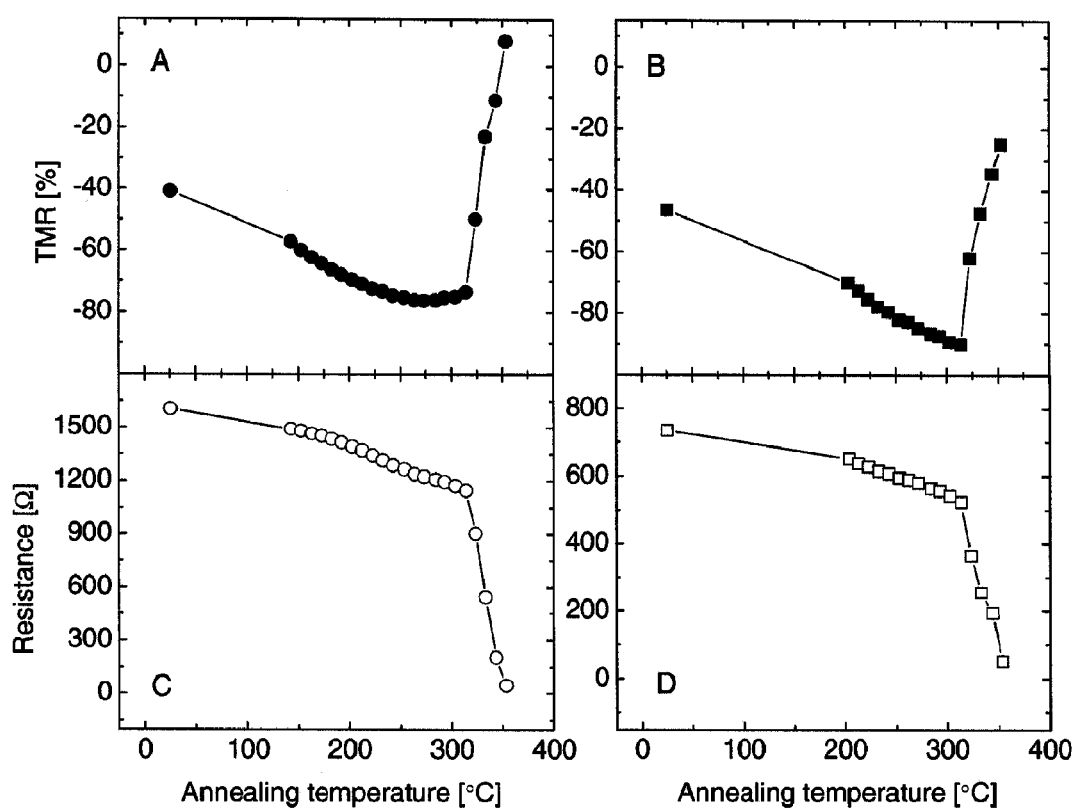
FIG. 21, which includes

FIG. 21 shows TMR and resistance versus annealing temperature for MTJs with Co—Fe/Co—Fe—Gd top electrodes for two samples with 15 Å (FIG. 21A) and 30 Å (FIG. 21B) thick Co—Fe interlayer thicknesses, respectively. The MTJs with 15 Å thick interlayers are stable to about 300° C. The absolute value of the TMR increases (from ~−40% to ~−75%), before the junctions break down. The samples with 30 Å thick Co—Fe interlayers are slightly more stable (to about 310° C.) and have higher TMR (~−90%). The interlayer likely improves the thermal stability of the junctions by preventing the RE atoms in the RE—TM layer from reacting with oxygen in the barrier. Doubling the thickness of the interlayer does not significantly increase the breakdown temperature, but optimizing the growth of the barrier and choice of interlayer material is likely to improve the thermal stability.

Thus, the insertion of a thin CoFe interlayer between the tunnel barrier and a RE—TM electrode is highly advantageous and significantly increases the absolute value of TMR as well as the thermal stability of the MTJs. This is possible because the Co—Fe interlayer is strongly exchange coupled to the Co—Fe—Gd layer (anti-parallel to the Gd magnetic moment and parallel to the Co and Fe magnetic moments). This means that for fields just above the coercivity of the free layer 55, the magnetic moment of the interlayer will be oriented opposite to the applied field. For sufficiently high fields, when the Zeeman energy of the interlayer moment becomes larger than the exchange energy between the interface moment and the CoFeGd layer moment, the interlayer moment will also become aligned to the magnetic field.

Figure 22:
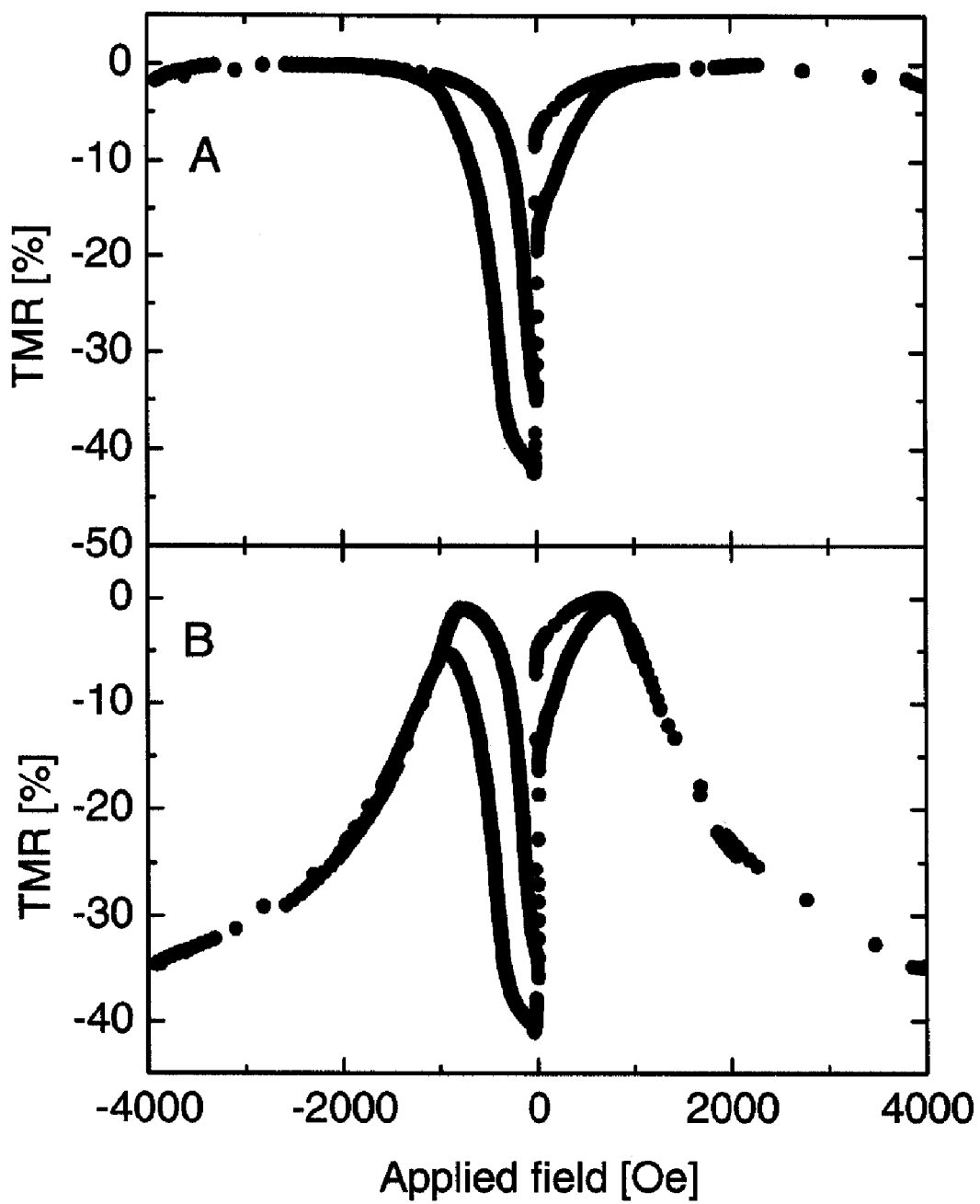
FIG. 22, which includes

Such a reversal of the magnetization of the interlayer will result in a decrease of the MTJ resistance as shown in FIG. 22. FIG. 22 shows the TMR versus field loops for two samples with different interlayer thicknesses, where the field is increased to the maximum value available in the measurement apparatus (4000 Oe). While the exchange energy is constant with interlayer thickness t, the magnetostatic energy is proportional to t. Thus the field necessary to decouple the bi-layer 55 is inversely proportional to t. While the sample with a 25 Å thick interlayer shows no decoupling of the interface layer and the RE—TM layers up to 4000 Oe (FIG. 22A), the sample with a 50 Å thick interlayer shows a decoupling at low field (FIG. 22B). The interface energy per unit area $\Delta_E$ can be calculated from $$\Delta_E = M_{FM} t_{FM} H_E$$

where $M_{FM}$ is the interlayer saturation magnetization, $t_{FM}$ is the thickness of the interlayer, and $H_E$ is the magnitude of the exchange field. Thus, $\Delta_E$ is calculated to be 1.5 erg/cm². This interface energy is high compared to, for example, the exchange bias coupling energy at the IrMn/CoFe interface ($\Delta_E$=0.19 erg/cm²)[5]. For this reason, compensated RE—TM films have been used to exchange bias FM films[59,60]. The strong exchange coupling between TM and RE—TM layers confirms the advantages of using Co—Fe/Co—Fe—Gd bilayers as free layers in MTJ devices as the magnetic fields needed to decouple the layers are well below typical free layer coercivities for reasonable interlayer thicknesses.

In summary, RE—TM alloy layers and, more particularly, TM/RE—TM bilayers in which the RE component dominates the magnetization of the bilayer composite have been demonstrated to be sources of highly negatively spin-polarized current. There have been very few prior art observations of negatively spin polarized current. Negative spin polarization has been observed in the ferromagnetic oxide $SrRuO_3$[14] in STS measurements and negative TMR has been realized in MTJs which contain one $SrRuO_3$ electrode[65]. However, the Curie temperature of $SrRuO_3$ is well below room temperature (~140 K), so this material is not useful for technological applications. Negative TMR has similarly been observed in tunnel junctions containing $Fe_3O_4$ and $La_{1-x}Sr_xMnO_3$ (LSMO) electrodes at low temperatures[66]. Negative TMR has been observed at room temperature in MTJs with a single $Fe_3O_4$ electrode and a CoFe counter-electrode[67]. However, the observed TMR values are much smaller than those found here using TM/RE—TM bilayers 55. Furthermore, it is well known that it is very difficult to saturate magnetite layers even in large magnetic fields, and the fabrication of $Fe_3O_4$ is complicated due to the metastable nature of $Fe_3O_4$.

Negative TMR has also been observed in MTJs using $SrTiO_3$ and $Ta_2O_5$ tunnel barriers but the effects are either observed only at low temperatures or in limited bias voltage ranges. For example, negative TMR has been observed in Co/STO/LSMO junctions but only at low temperatures (5K)[68], and the magnitude of negative TMR in junctions with $Ta_2O_5$ at room temperature is low (~4%) and can only be observed for limited bias voltages. Similarly, very low (<5%) negative TMR values have been obtained with insertion of thin layers of paramagnetic elements (Au[69] and Ru[70]) between a Co electrode and an $Al_2O_3$ barrier. Thus, although negative TMR has been found in a small number of other material systems none of these systems gives significant negative TMR at room temperature.

Figure 23:
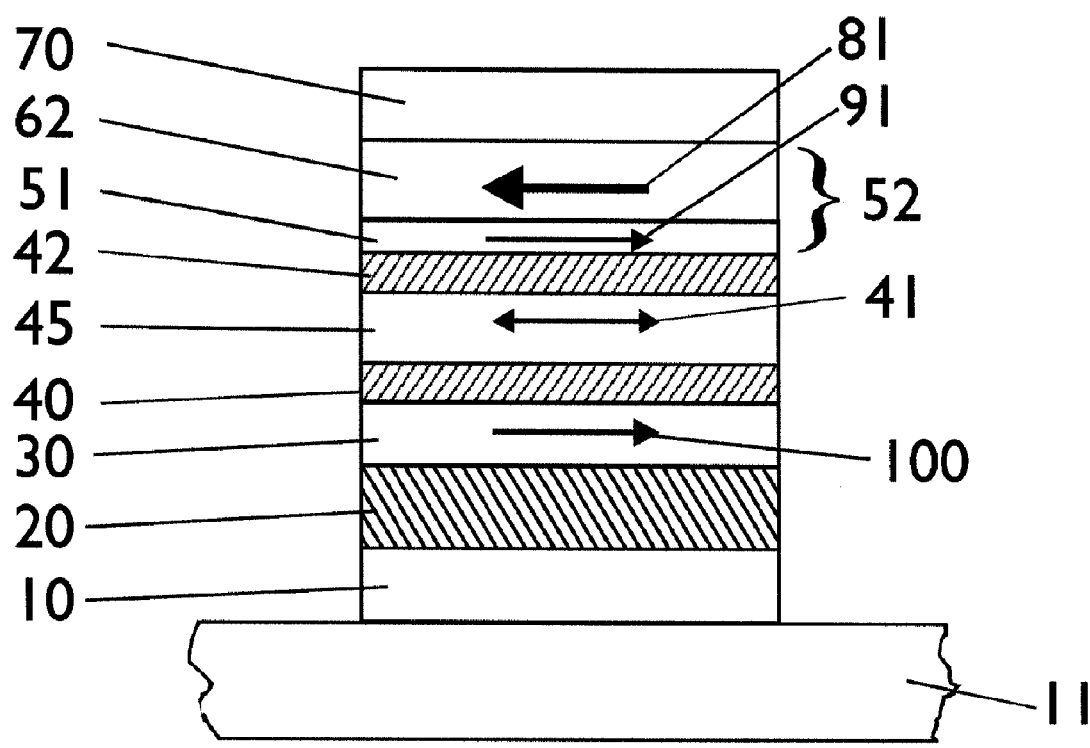
FIG. 23 shows a cross sectional view of a double tunnel junction (DTJ) of the present invention.

There are many possible applications in which the use of negatively spin polarized magnetic materials and negative TMR effects are needed. One application is flux closed double tunnel junction devices for MRAM MTJ storage cells and for field sensors. Double tunnel junctions (DTJs) are MTJ structures which have at least three ferromagnetic (and/or ferrimagnetic) electrodes and two tunnel barriers, as shown in one exemplary structure in FIG. 23. A voltage bias is applied between the top and bottom electrode electrodes 52 and 30, so that electrons tunnel sequentially through both insulating barriers 40 and 42. The thickness and area of the middle magnetic electrode 45 can strongly influence the transport properties of the device. (The embodiment shown in FIG. 23 is described in greater detail below.)

Thin and small area middle electrodes can lead to resonant tunneling effects or Coulomb blockade effects. For sufficiently large or thick middle electrodes, or at high enough temperatures, Coulomb blockade effects are not observed. In many case the properties of the DTJ structure are simply those of two single tunnel junctions (STJs) connected in series. The tunneling magnetoresistance for the DTJ depends on the relative orientation of the magnetizations of all three ferromagnetic (and/or ferrimagnetic) electrodes. If $R_{low}^{1,2}$ and $R_{high}^{1,2}$ are the low and high resistance states of the $1^{st}$ and $2^{nd}$ STJ, respectively, then the TMR of the DTJ can be written as:

$$TMR = \frac{(R^1 + R^2) - (R_{low}^1 + R_{low}^2)}{(R_{low}^1 + R_{low}^2)}$$

where $R^1$ and $R^2$ are the resistances of the $1^{st}$ and $2^{nd}$ STJ which depend on the field.

The TMR will depend on the magnetic state of all three electrodes. Assuming that the directions of the magnetic moments of each of the three electrodes can be aligned either along or opposite to a given easy magnetic anisotropy direction (and which is the same for all three layers), there will be four well defined resistance states of the DTJ corresponding to the $1^{st}$ and $2^{nd}$ STJs being in the low/low, high/low, low/high and high/high resistance states, respectively. If the low and high resistance values are the same for both STJs then there will only be three resistance states of the DTJ (low/high and high/low being the same). The maximum TMR value is found when the state of the STJs is changed from high/high to low/low. This value corresponds to the TMR values of the two single tunnel junctions weighted by their respective resistances. No enhancement of the TMR of the DTJ is expected compared to that of the individual STJs unless there is coherent tunneling of the electrons across the middle electrode 45.

DTJs are of interest as they should display an improved bias voltage dependence of the TMR as compared to an STJ. From the earliest results of Julliere, the TMR has been found experimentally to decrease monotonically with increasing voltage bias in nearly all cases. The decrease of TMR with bias is often characterized by the property $V_{50}$, the voltage at which the TMR is decreased to half the zero bias TMR. Typically $V_{50}$ lies in the range from ~0.2 to 0.6 Volt but in some cases $V_{50}$ may be as high as 1 V. Since in a DTJ the voltage drop across one junction is only half of the overall applied voltage, the $V_{50}$ for a DTJ should be twice as high as that for an STJ, assuming both STJs in the DTJ have identical resistance values and $V_{50}$ values. Experimentally, it is very difficult to prepare identical STJs in a DTJ, so reports of improved $V_{50}$ values for DTJs more than twice as high as the individual STJs are likely due to variations in junction properties rather than any intrinsic effects[61,62]. Nevertheless, the improvements in $V_{50}$ make DTJs attractive for applications even though their structure is more complicated. Another significant advantage of a DTJ is that the voltage across each junction can be much lower relative to the breakdown voltage, so the lifetime of the device is likely to be significantly increased.

The maximum TMR in a DTJ is observed if both STJs are simultaneously switched from a low to a high resistance state. Therefore the middle electrode should serve as the free layer. The configuration of the top and bottom electrode magnetizations that yields the highest TMR will depend on the spin polarization of the electrodes. For example, if all three electrodes are positively spin polarized then the magnetization of both the bottom and top electrodes should be set parallel to one another and reversal of the middle electrode will yield the highest TMR. The magnetization directions of the bottom and top electrodes can be fixed either by exchange biasing with antiferromagnetic layers or by using layers which have a higher coercive field as compared to the middle electrode.

FIGS. 24A and 24B show, respectively, major and minor TMR loops versus field for a double tunnel junction where all electrodes are positively polarized and the top and bottom ferromagnets are exchange-biased. The structure is as follows:

200 Å TaN/75 Å Ta/250 Å $Ir_{78}Mn_{22}$/40 Å $Co_{70}Fe_{30}$/40 Å MgO/30 Å $Co_{70}Fe_{30}$/39 Å MgO/80 Å $Co_{70}Fe_{30}$/150 Å $Ir_{22}Mn_{78}$/75 Å TaN/75 Å Ru

The exchange bias field is much smaller for the top electrode as compared to the bottom electrode but is sufficiently large to allow separation of the switching of the top and middle (free) layer. The TaN/Ru layer on top serves as a capping layer. The data shown were taken after a thermal anneal at 260° C. for 90 min. The maximum TMR of the DTJ is ~90%. The resistance is highest when both STJs are in the anti-parallel magnetization configuration and an intermediate resistance is achieved when the top STJ is in the low resistance state (parallel configuration) and the bottom STJ is in the high resistance state (anti-parallel configuration). The magnitude of this intermediate TMR depends on the resistances and TMR of both STJs. For example, increasing the resistance of the top STJ, while keeping the TMR constant, would result in a lower intermediate TMR value. The TMR loops in FIG. 24 demonstrate that double tunnel junctions with high TMR and comparable resistance for both STJs can be reliably prepared.

Using negatively spin polarized RE—TM alloys, DTJs can be fabricated that show negative TMR by employing a negatively polarized middle electrode. FIG. 25 shows a double tunnel junction with $Co_{30}Fe_{30}Gd_{40}$ as the middle electrode. Thin $Co_{70}Fe_{30}$ interlayers are inserted between the CoFeGd layer and the tunnel barriers to increase TMR and the thermal stability. Thus the middle electrode is comprised of a trilayer structure CoFe/CoFeGd/CoFe wherein the layers are strongly exchange coupled to one another so that the trilayer behaves as a single magnetic layer or electrode. Similar to the DTJ of FIG. 24, both the bottom and top electrodes are exchange biased and the middle electrode serves as a free layer. The structure is 200 Å TaN/75 Å Ta/250 Å $Ir_{78}Mn_{22}$/40 Å $Co_{70}Fe_3O$/38 Å MgO/17.5 Å $Co_{70}Fe_{30}$/300 Å $Co_{30}Fe_{30}Gd_{40}$/17.5 Å $Co_{70}Fe_{30}$/38 Å MgO/100 Å $Co_{70}Fe_{30}$/150 Å $Ir_{22}Mn_{78}$/75 Å TaN/75 Å Ru In the minor loop shown in FIG. 25B, one can see that the middle and top electrode switching fields are well separated. The CoFeGd composition and thickness are chosen such that the electrode exhibits negative spin polarization at room temperature, i.e., the two CoFe interface layer moments are antiparallel to the magnetic moment of the inner CoFeGd layer, and the magnetic moment from the Gd sub-lattice magnetization in the CoFeGd layer is larger than the sum of both the CoFe sub-lattice magnetization in the CoFeGd layer and the magnetic moment contributions from the CoFe interface layers. Note that in the schematics of FIG. 25A showing the orientation of the magnetic moments of the top, middle and bottom electrodes, the direction of the net moment of the CoFe/CoFeGd/CoFe middle electrode is shown.

The TMR loops in FIG. 25A and 25B are measured after a reset anneal at 260° C. For large enough positive fields, the moments of all three electrodes will be aligned parallel to one another. As the field is reduced from this high value, the middle electrode, which has the smallest switching field, will reverse its magnetization direction. Reversal of the CoFe/Co—Fe—Gd/CoFe middle layer magnetization results in both the bottom and top junctions changing from a high to a low resistance state (see schematics in FIG. 25A). The TMR is around −50%, which is lower than the TMR observed in comparable DTJs which use CoFe middle electrodes without any CoFeGd. The switching of the exchange biased top electrode can also be observed in both the major and minor loops but the relative change in resistance is much lower than would be expected if both of the tunnel barriers had the same resistance. If the resistance and TMR for both junctions were the same, one would expect a resistance change upon switching of the top electrode that is half of the resistance change found when the middle electrode magnetization is reversed (for the top and bottom electrodes both aligned in the same direction, so that the middle electrode moment direction is reversed with respect to both of these other electrodes). The observed resistance change is much lower, indicating that either TMR or resistance of the top electrode is low. One possible explanation is that, since the Co—Fe—Gd layer is amorphous, the upper Co—Fe interlayer does not grow as a well textured (100) body centered cubic layer, but rather grows poorly textured so that the upper MgO barrier and the Co—Fe top electrode do not grow as well textured as the bottom junction. By contrast, as described in the pending US patent applications to Parkin titled "High performance magnetic tunnel barriers with amorphous materials" (Ser. No. 10/884,831 filed Jul. 2, 2004) and "Magnetic tunnel junctions using amorphous materials as reference and free layers" (Ser. No. 10/904,449 filed Nov. 10, 2004), both of which are incorporated herein by reference, MgO barriers can be grown very well textured 100 on amorphous underlayers.

As discussed above, it is desirable to reduce the magnetostatic fields in magnetic tunnel junctions used in MRAM elements. These fields arise from magnetic charges at the edges of magnetic layers and become larger for smaller magnetic elements. One possibility to reduce the magnetostatic fields is to use materials with low saturation magnetization (e.g., Co—Gd alloys with nearly compensated subnetwork magnetizations), but these may not be stable against thermal fluctuations. Another approach is to build a flux-closed device structure which can allow the use of magnetic films with sufficient magnetic moment to be stable against thermal fluctuations. By balancing layers with opposite magnetic moments (and associated edge charges) stray fields can be minimized, so that the storage electrode can both have sufficient magnetic moment to be stable against thermal fluctuations as well as display a magnetic hysteresis loop that is symmetric with respect to positive and negative magnetic fields.

Figure 24:
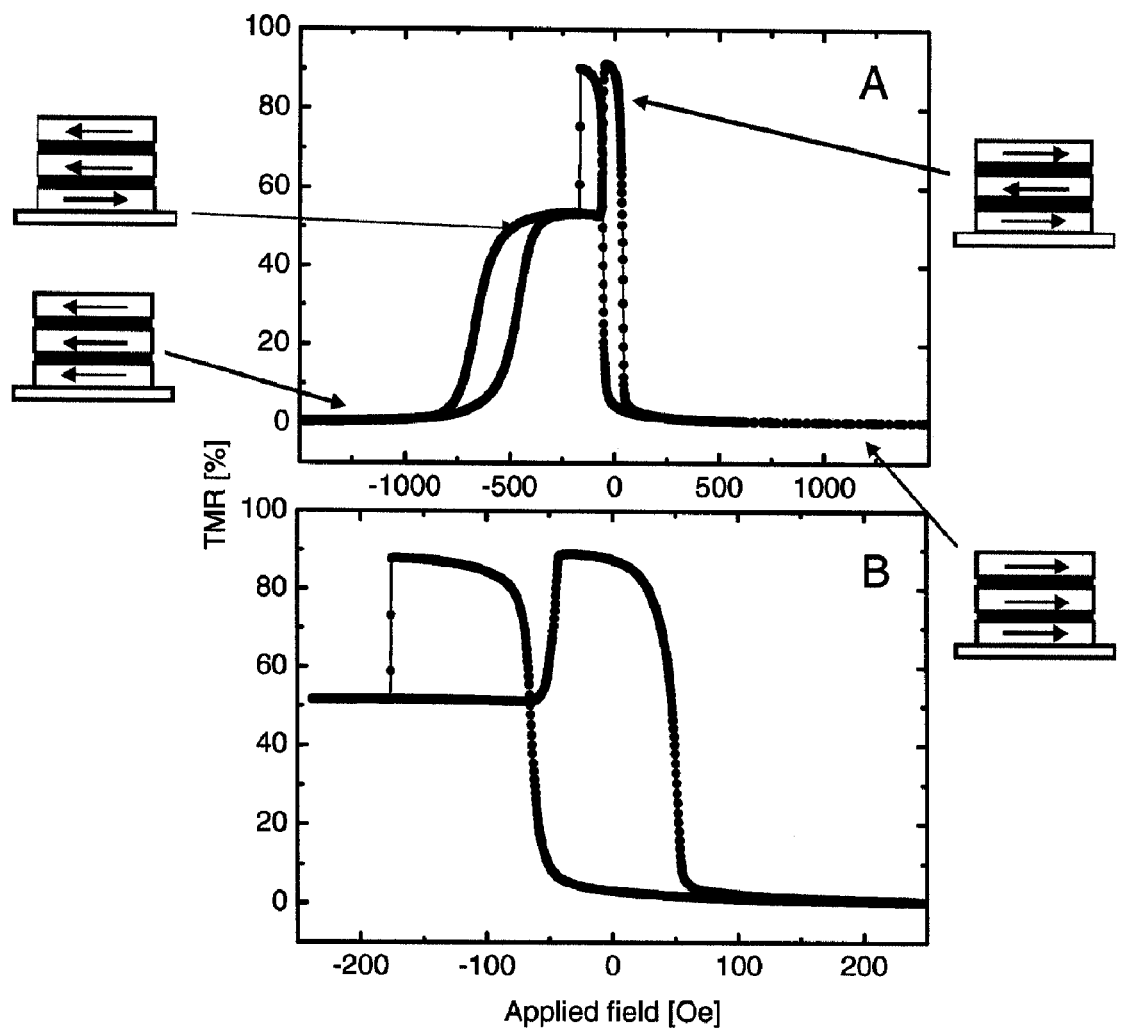
FIG. 24, which includes
Figure 25:
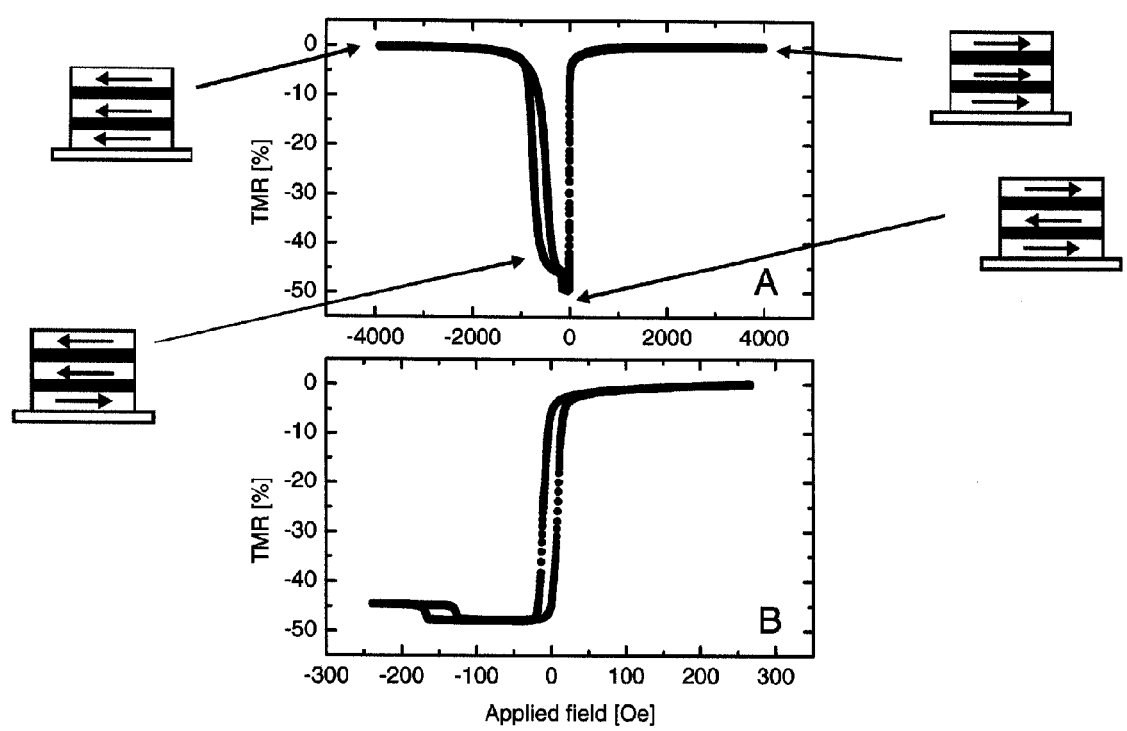
FIG. 25, which includes

In a conventional DTJ with positively polarized electrodes, such as that corresponding to the data in FIG. 24, the magnetization of the bottom and top electrodes are pinned in the same direction and the middle electrode constitutes the free layer. Reversal of the magnetization of the middle electrode then leads to a maximum resistance change. However, in this configuration the middle electrode will be subject to significant magnetostatic fields due to edge charges from both the top and bottom layers, which are additive (i.e., along the same direction). If the magnetizations of the top and bottom electrodes were, by contrast, pinned in opposite directions, so as to make them flux closed, the magnetostatic fields from these layers would also be in opposite directions so that the net magnetostatic field sensed by the middle electrode would be significantly reduced. However, the TMR upon switching of the free layer (middle electrode) would be reduced (or even zero for STJs which have the same resistance and TMR). However, by using a magnetic material that is negatively spin polarized for the top or the bottom electrode (but not both) one obtains a DTJ which has both low magnetostatic fields as well as high TMR. In this case the magnetizations of the top and bottom electrodes are pinned in opposite directions while the middle electrode serves as the free magnetic layer. The top and bottom electrodes can be pinned by a variety of means including exchange biasing or by simply having higher coercivities than the free layer (in the latter case the top and bottom electrodes would also need to have different coercivities so that, by a proper sequence of magnetic field applications, their moments could be set in opposite directions). For exchange biased electrodes it is possible to use a sequence of temperature and field steps so that the top and bottom electrodes are pinned in opposite directions, e.g., by using exchange biasing layers with different blocking temperatures (for example by forming them from antiferromagnetic materials that have different blocking temperatures such as IrMn, PtMn, NiMn, or FeMn alloys, or by varying the blocking temperature for the same antiferromagnetic material by using exchange bias layers of different thicknesses).

The double tunnel structure shown in FIG. 23 has a top electrode which is negatively polarized. Here the magnetization of the middle electrode 45 is free to switch (as indicated by arrow 41) while the top and bottom electrodes 52 and 30 have magnetizations fixed in opposite directions.

The top electrode 52 shown in FIG. 23 has a thin interlayer 51 (which has a magnetic orientation given by the arrow 91) that is exchange coupled antiparallel to a RE—TM electrode 62. Thus the interface layer is chosen to have a high positive spin polarization. In the RE—TM electrode, the RE sub-network dominates the magnetization (denoted by the arrow 81) and is oriented opposite to the interlayer magnetization, which is chosen not only to be highly spin polarized but also to couple parallel to the TM sub-network and anti-parallel to the RE sub-network in layer 62. Thus upon reversal of the magnetization of the middle layer 45, a maximum change in resistance of the DTJ is achieved while the magnetizations of the top and bottom electrodes 52 and 30 are oriented anti-parallel, thereby reducing the magnetostatic fields.

The electrode 52 may also be formed without the interface layer 51 providing that the layer 62 is then composed of a material with negative spin polarization at room temperature. Suitable materials include magnetite, $Fe_3O_4$ and the class of RE—TM alloys formed from Co, Fe and Ni and the heavy RE elements (Gd to Yb). For the RE—TM alloys, as previously explained, the RE concentration should be high enough that the RE sub-network dominates the net magnetization of the alloy. The composition and layer thickness of the RE—TM alloy layer 62 can then be adjusted for a desired saturation magnetization as well as coercivity and magnetic anisotropy, etc.

The orientation of the top layer moment can be fixed using exchange biasing, a synthetic antiferromagnet structure or coercivity.

Figure 26:
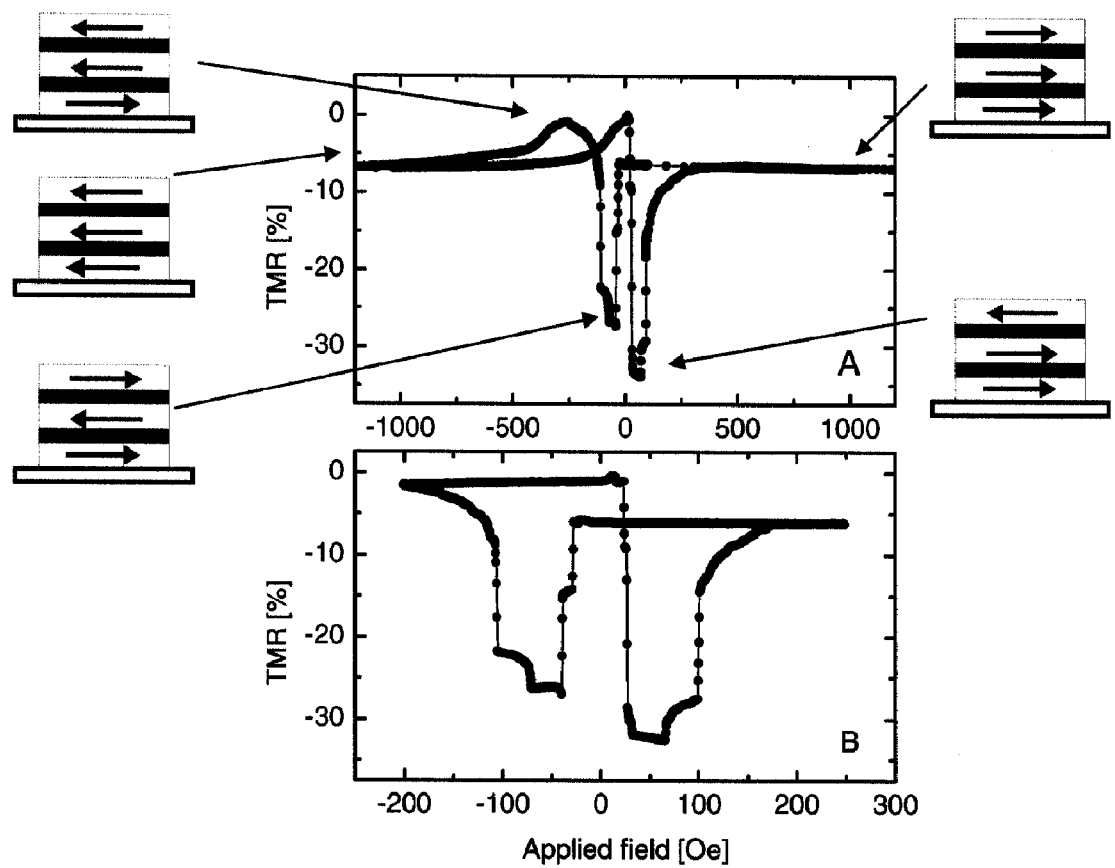
FIG. 26, which includes

To construct such a structure, DTJs using a negatively spin-polarized Co—Fe—Gd top electrode were prepared. The composition of the Co—Fe—Gd electrode is engineered such that its coercivity is higher than the coercivity of the middle electrode. This ensures that the hysteresis loops of middle and top electrodes are well separated. FIG. 26 shows the resulting MR loop. The middle electrode has the lowest coercivity followed by the top (Co—Fe—Gd) electrode. Upon reversal of the free layer (middle electrode) magnetization, a TMR of around −33% can be achieved. Much higher TMR values are possible by optimization of the materials and structure.

To properly balance the magnetic moments of the electrodes and to achieve highest TMR, electrode materials as well as layer thicknesses should be chosen properly. As $Co_{70}Fe_{30}$ has been shown to have the highest spin polarization for 3d transition metal alloys, its use as the bottom electrode, middle electrode and interlayer between the top barrier and the RE—TM top electrode is favored. However, to optimize exchange bias strength, coercivity or growth of the structures, other Co—Fe compositions or Co—Fe—Ni alloys might be chosen. Similarly, one or more of these electrodes may be formed from amorphous layers such as those obtained when alloys formed from one or more of Co, Fe and Ni are combined with small amounts (in the range from 8 to 30 atomic percent or, more preferably in the range from 8 to 16 atomic percent) of one or more glass forming elements such as B, Hf, Zr, Si and C. From the experiments outlined above, the Co—Fe interlayer between the top barrier and the RE—TM electrode is preferably at least ~15 Å thick to achieve highest TMR. The interface layer may also be formed from an amorphous alloy such as CoFeB. The bottom and middle magnetic layer thicknesses can then be chosen to achieve proper exchange bias, coercivity and growth of the structure, while the thickness of the middle layer should be kept as thin as possible to reduce its magnetostatic field.

The composition and thickness of the top RE—TM electrode can then be adjusted to balance out the moments of the bottom and interlayer as well as to maximize the Curie temperature and attain suitable coercivity. The desired Curie temperature limits the RE—TM composition to a certain range, as too high RE concentrations lead to Curie temperatures below room temperature. Furthermore, the RE concentration of the layer 62 has to be high enough that the RE sub-network magnetization dominates the overall magnetization. For alloys of i) Fe or Co and ii) Gd, Tb, Dy, or Ho, this minimum RE concentration is between 20 and 30 atomic %[63,64]. Depending on the magnetization of the RE—TM alloy and the Co—Fe bottom and interlayer thickness, the RE—TM layer thickness can be adjusted to achieve a compensated magnetization. For example, if a $Co_{70}Fe_{30}$ bottom layer of 15 Å is chosen and the $Co_{70}Fe_{30}$ interlayer is also 15 Å thick, then a ~150 Å thick $Co_{65}Gd_{35}$ layer could be used to compensate the moments (which has a Curie Temperature of >450 K). RE dominated alloys of Co with Gd, Tb, Dy, and Ho show Curie temperatures well above room temperature for certain composition ranges, but the maximum magnetization is rather low for Tb, Dy and Ho based alloys (<200 emu/cm$^3$) as compared to Gd based alloys (>450 emu/cm$^3$)[63,64]. Thus, if the RE—TM alloy film thickness is kept as small as possible, then Gd based alloys are favored. The substitution of Co with Fe can increase the Curie temperature for certain RE concentrations. Furthermore, Gd can be substituted by Tb to increase the coercivity of the alloy.

The above results demonstrate that double tunnel junctions with separate magnetic alignment of all three layers with field can be fabricated. Using RE—TM electrodes with negative spin polarization, flux closed DTJs were prepared having an (absolute magnitude) maximum TMR of −33%. These signal values can be increased with improved sample preparation and/or exchange biasing of the RE—TM electrode.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

REFERENCES

1. Julliere, M. Tunneling between ferromagnetic films. *Phys. Lett.* 54A, 225-226 (1975).
2. Miyazaki, T. & Tezuka, N. Giant magnetic tunneling effect in Fe/Al$_2$O$_3$/Fe junction. *J. Magn. Magn. Mat.* 139, L231-L234(1995).
3. Moodera, J. S., Kinder, L. R., Wong, T. M. & Meservey, R. Large magnetoresistance at room temperature in ferromagnetic thin film tunnel junctions. *Phys. Rev. Lett.* 74, 3273-3276 (1995).
4. Parkin, S. S. P. et al. Magnetically engineered spintronic sensors and memory. *Proc. IEEE* 91, 661-680 (2003).
5. Nogués, J. & Schuller, I. K. Exchange bias. *J. Magn. Magn. Mat.* 192, 203 (1999).
6. Meservey, R. & Tedrow, P. M. Spin-polarized electron tunneling. *Phys. Rep.* 238, 173-243 (1994).
7. Monsma, D. J. & Parkin, S. S. P. Spin polarization of tunneling current from ferromagnet/Al$_2$O$_3$ interfaces using copper-doped aluminum superconducting films. *Appl. Phys. Lett.* 77, 720 (2000).

8. Nadgorny, B. et al. Transport spin polarization of $Ni_xFe_{1-x}$: Electronic kinematics and band structure. *Phys. Rev. B* 61, R3788 (2000).

9. Kim, T. H. & Moodera, J. S. Large spin polarization in epitaxial and polycrystalline Ni films. *Phys. Rev. B* 69, 020403(R) (2004).

10. Paraskevopoulos, D., Meservey, R. & Tedrow, P. M. Spin polarization of electrons tunneling from 3d Ferromagnetic metals and alloys. *Phys. Rev. B* 16, 4907 (1977).

11. Kaiser, C. in *II. Physikalisches Institut*(RWTH-Aachen, Aachen, 2001).

12. Verwey, E. J. W. & Haayman, P. W. Electronic conductivity and transition point of magnetite ("$Fe_3O_4$"). *Physica VIII*, 979 (1941).

13. Panchula, A. F., Kaiser, C., Kellock, A. & Parkin, S. S. P. Spin polarization and magnetotransport of Mn—Sb alloys in magnetic tunnel junctions. *Appl. Phys. Lett.* 83, 1812 (2003).

14. Worledge, D. C. & Geballe, T. H. Negative Spin-Polarization of SrRuO3. *Phys. Rev. Lett.* 85, 5182-5185 (2000).

15. Parkin, S. S. P., More, N. & Roche, K. P. Oscillations in exchange coupling and magnetoresistance in metallic superlattice structures: Co/Ru, Co/Cr and Fe/Cr. *Phys. Rev. Lett.* 64, 2304-2307 (1990).

16. Gambino, R. J. in *Magneto-optical recording materials* (IEEE Magnetics Society, 2000).

17. Hansen, P. Magneto-optical recording materials and technologies. *J. Magn. Magn. Mat.* 83, 6-12 (1990).

18. Chaudhari, P., Cuomo, J. J. & Gambino, R. J. Amorphous metallic films for magneto-optic applications. *Appl. Phys. Lett.* 22, 337 (1973).

19. Hansen, P. in Landolt-Bornstein Numerical Data and Functional Relationships in Science and Technology: New Series (ed. Madelung, O.) 136-221 (Springer-Verlag, Berlin, 1988).

20. Nesbitt, E. A. & Wernick, J. H. *Rare-earth permanent magnets* (Academic Press, New York, 1973).

21. Campbell, I. A. Indirect exchange for rare earths in metals. *J. phys. F: Met. Phys.* 2, L47-50 (1972).

22. Coey, J. M. D. Amorphous magnetic order. *J. Appl. Phys.* 49,1646-1652 (1978).

23. Hansen, P., Clausen, C., Much, G., Rosenkranz, M. & Witter, K. Magnetic and magneto-optical properties of rare-earth transition-metal alloys containing Gd, Tb, Fe, Co. *J. Appl. Phys.* 66, 756-767 (1989).

24. Hansen, P. in *Handbook of Magnetic Materials* (ed. Buschow, K. H. J.) 289 (Elsevier Science, Amsterdam, 1991).

25. Taylor, R. C. & Gangulee, A. Magnetization and magnetic anisotropy in evaporated GdCo amorphous films. *J. Appl. Phys.* 47, 4666 (1976).

26. Taylor, R. C. & Gangulee, A. Magnetic anisotropy in evaporated amorphous films of the ternary system $Gd_x(Fe_{1-y}Co_y)_{1-x}$. *J. Appl. Phys.* 48, 358-361 (1977).

27. Katayama, T., Hirano, M., Koizumi, Y., Kawanishi, K. & Tsushima, T. Different origin of the perpendicular anisotropy in amorphous Gd-Fe from Gd-Co films. *IEEE Trans. Magn.* 13, 1603-1605 (1977).

28. Ohkoshi, M., Harada, M., Tokunaga, T., Honda, S. & Kusuda, T. Effects of Air pressure and substrate bias on magnetic properties and microstructure in amorphous TbCo sputtered films. *IEEE Trans. Magn.* 21, 1635-1637 (1985).

29. Hoshi, Y. & Yamanaka, M. N. S. Influence of O2 and N2 addition on the perpendicular magnetic anisotropy of Gd—Co amorphous films. *J. Appl. Phys.* 53, 2344-2346 (1982).

30. Hasegawa, R., Gambino, R. J., Cuomo, J. J. & Ziegler, J. F. Effect of thermal annealing and ion radiation on the coercivity of amorphous GdCo films. *J. Appl. Phys.* 45, 4036-4040 (1974).

31. Katayama, T., Hasegawa, K., Kawanishi, K. & Tsushima, T. Annealing effects on magnetic properties of amorphous GdCo, GdFe, and GdCoMo films. *J. Appl. Phys.* 49, 1759-1761 (1978).

32. Hartmann, M., Klahn, S. & Witter, K. Aging mechanisms in amorphous GdTbFe films. *IEEE Trans. Magn.* 23, 2946-2948 (1987).

33. Luborsky, F. E. Kinetics for changes in anisotropy, coercivity, and argon content of transition metal-rare earth films. *J. Appl. Phys.* 57, 3592-3594 (1985).

34. Hellman, F. & Gyorgy, E. M. Growth-induced magnetic anisotropy in amorphous Tb—Fe. *Phys. Rev. Lett.* 68, 1391-1394 (1992).

35. Cargill, G. S. & Mizoguchi, T. Dipolar mechanisms for magnetic anisotropy in amorphous ferrimagnetic alloys. *J. Appl. Phys.* 49, 1753-1755 (1978).

36. Néel, L. *J. Phys. Radium* 15, 225(1954).

37. Taniguchi, S. *Sci. Rep. Res. Inst.* A7, 269 (1955).

38. Harris, V. G. & Pokhil, T. Selective-Resputtering-Induced Perpendicular Magnetic Anisotropy in Amorphous TbFe Films. *Phys. Rev. Lett.* 87, 067207 (2001).

39. Nishimura, N. et al. Magnetic tunnel junction device with perpendicular magnetization films for high-density magnetic random access memory. *J. Appl. Phys.* 91, 5246-5249 (2002).

40. Bellouard, C. et al. Negative spin-valve effect in $Co_{65}Fe_{35}/Ag/(Co_{65}Fe_{35})_{50}Gd_{50}$ trilayers. *Phys. Rev. B* 53, 5082 (1996).

41. Luborsky, F. Some aspects of the stability and anisotropy of amorphous Co—Gd films. *IEEE Trans. Magn.* 20 (1984).

42. Tsunashima, S., Shinoda, T., Miyatake, H. & Uchiyama, S. Influence of oxygen adsorption on perpendicular anisotropy in amorphous Gd—Fe and Gd—Co films. *J. Appl. Phys.* 51, 5901-5905 (1980).

43. Meservey, R., Paraskevopoulos, D. & Tedrow, P. M. Spin polarized tunneling in rare earth ferromagnets. *J. Appl. Phys.* 49, 1405 (1978).

44. Meservey, R., Paraskevopolous, D. & Tedrow, P. M. Correlation between Spin Polarization of Tunnel Currents from 3d Ferromagnets and Their Magnetic Moments. *Phys. Rev. Lett.* 37, 858 (1976).

45. Kaiser, C., Dijken, S. v. & Parkin, S. S. P. Important role of tunneling matrix elements in determining magnitude of tunneling spin polarization of 3d transition metal ferromagnetic alloys. *preprint*(2004).

46. Choe, G., Becker, M. F. & Walser, R. M. Effect of oxygen on compositionally modulated Gd—Co thin films. *J. Appl. Phys.* 64, 6104 (1988).

47. Frankenthal, R. P., Siconolfi, D. J., Dover, R. B. v. & Nakahara, S. Oxidization of amorphous Iron-Terbium alloy. *J. Electrochem. Soc.* 134, 235-239 (1987).

48. Dover, R. B. v., Gyorgy, E. M., Frankenthal, R. P., Hong, M. & Siconolfi, D. J. Effect of oxidation on the magnetic properties of unprotected TbFe thin films. *J. Appl. Phys.* 59, 1291 (1986).

49. Miller, D. C., Marinero, E. E. & Notarys, H. XPS oxidation study of TbFeCo films. *Applied Surface Science* 35, 153-163 (1988).

50. O'Shea, M. J. & Perera, P. Influence of nanostructure (layers and particles) on the magnetism of rare-earth materials. *J. Appl. Phys.* 85, 4322-4324 (1999).

51. Huang, F., Mankey, G. J., Kief, M. T. & Willis, R. F. Finite-size scaling behavior of ferromagnetic thin films. *J. Appl. Phys.* 73, 6760-6762 (1993).

52. Buschow, K. H. J. Magnetic properties of amorphous rare-earth cobalt alloys. *J. Appl. Phys.* 51, 2795-2798 (1980).

53. Moodera, J. S., Nowak, J. & Veerdonk, R. J. M. v. d. Interface magnetism and spin wave scattering in ferromagnet-insulator-ferromagnet tunnel junctions. *Phys. Rev. Lett.* 80, 2941 (1998).

54. Shang, C. H., Nowak, J., Jansen, R. & Moodera, J. S. Temperature dependence of magnetoresistance and surface magnetization in ferromagnetic tunnel junctions. *Phys. Rev. B* 58, R2917-R2920 (1998).

55. Hagler, T., Kinder, R. & Bayreuther, G. Temperature dependence of tunnel magnetoresistance. *J. Appl. Phys.* 89, 7570 (2001).

56. Parkin, S. S. P. et al. Giant Tunneling Magnetoresistance at Room Temperature with MgO (100) Tunnel Barriers. *Nature Materials*, 3, 862, (2004).

57. Taylor, R. C. & Gangulee, A. Magnetic properties of the 3d transition metals in the amorphous ternary alloys: $Gd_{0.2}(Fe_xCo_{1-x})_{0.8}$, $Gd_{0.2}(Co_xNi_{1-x})_{0.8}$, and $Gd_{0.2}(Fe_x Ni_{1-x})_{0.8}$. *Phys. Rev. B*22, 1320-1326 (1980).

58. Mimura, Y., Imamura, N., Kobayashi, T., Okada, A. & Kushiro, Y. Magnetic properties of amorphous alloy films of Fe with Gd, Tb, Dy, Ho, or Er. *J. Appl. Phys.* 49, 1208 (1978).

59. Hellman, F., Dover, R. B. v. & Gyorgy, E. M. Unexpected unidirectional anisotropy in amorphous Tb—Fe/Ni—Fe—Mo bilayer films. *Appl. Phys. Lett.* 50, 296-298 (1987).

60. Tokunaga, T., Taguchi, M., Fukami, T., Nakaki, Y. & Tsutsumi, K. Study of interface wall energy in exchange-coupled double-layer film. *J. Appl. Phys.* 67, 4417-4419 (1990).

61. Inomata, K., Saito, Y., Nakajima, K. & Sagoi, M. Double tunnel junctions for magnetic random access memory devices. *J. Appl. Phys.* 87, 6064-6066 (2000).

62. Montaigne, F. et al. Enhanced tunnel magnetoresistance at high bias voltage in double-barrier planar junctions. *Appl. Phys. Lett.* 73, 2829 (1998).

63. Hansen, P., Clausen, C., Much, G., Rosenkranz, M. & Witter, K. Magnetic and magneto-optical properties of rare-earth transition-metal alloys containing Gd, Tb, Fe, Co. *Journal of Applied Physics* 66, 756-767 (1989).

64. Hansen, P., Klahn, S., Clausen, C., Much, G. & Witter, K. Magnetic and magneto-optical properties of rare-earth transition-metal alloys containing Dy, Ho, Fe, Co. *Journal of Applied Physics* 69, 3194-3207 (1991).

65. Takahashi, K. S. et al. Inverse tunnel magnetoresistance in all-perovskite junctions of $La_{0.7}Sr_{0.3}MnO_3/SrTiO_3/SrRuO_3$. *Phys. Rev. B* 67, 094413 (2003).

66. Hu, G., Chopdekar, R. & Suzuki, Y. Observation of inverse magnetoresistance in epitaxial magnetite/manganite junctions. *J. Appl. Phys.* 93, 7516 (2003).

67. Panchula, A. F. (Stanford University, 2003).

68. De Teresa, J. M. et al. Inverse Tunnel Magnetoresistance in $Co/SrTiO_3/La_{0.7}Sr_{0.3}MnO_3$: New Ideas on Spin-Polarized Tunneling. *Phys. Rev. Lett.* 82, 4288 (1999).

69. Moodera, J. S. et al. Quantum Well States in Spin-Dependent Tunnel Structures. *Phys. Rev. Lett.* 83, 3029 (1999).

70. LeClair, P. et al. Sign reversal of spin polarization in $Co/Ru/Al_2O_3/Co$ magnetic tunnel junctions. *Phys. Rev. B* 64, 100406(R) (2001).

What is claimed is:

1. A device, comprising:
   a first tunnel barrier; and
   a first layer that includes a rare earth element-transition metal (RE—TM) alloy in proximity with the first tunnel barrier, wherein:
   the RE—TM alloy includes at least one element selected from the group consisting of Gd, Tb, Dy, Ho, Er, Tm, and Yb;
   the RE—TM alloy includes respective RE and TM sub-network moments such that the absolute magnitude of the RE sub-network moment is greater than the absolute magnitude of the TM sub-network moment; and
   the respective RE and TM sub-network moments and concentrations are selected to enable negatively spin-polarized current to pass between the first tunnel barrier and the first layer at room temperature.

2. The device of claim 1, further comprising a second layer that includes magnetic material selected from the group of materials consisting of ferromagnetic materials and ferrimagnetic materials, wherein the second layer is in proximity with the first tunnel barrier, so that the device forms a magnetic tunnel junction.

3. The device of claim 2, wherein the RE—TM alloy is selected so that the device has a negative tunneling magnetoresistance at one temperature but a positive tunneling magnetoresistance at another temperature.

4. The device of claim 2, further comprising an interface layer between the first tunnel barrier and the first layer, wherein the interface layer is selected to increase at least one of: i) the absolute value of the tunneling magnetoresistance of the magnetic tunnel junction and ii) the thermal stability of the magnetic tunnel junction.

5. The device of claim 4, wherein the interface layer comprises a Co-Fe alloy.

6. The device of claim 2, wherein the RE—TM alloy includes at least one of Co—Gd, CoFe—Gd, Tb—Fe, Co—Tb, and CoFe—Tb.

7. The device of claim 2, wherein the first tunnel barrier includes at least one of a MgO tunnel barrier and a Mg—ZnO tunnel barrier.

8. The device of claim 2, wherein the first tunnel barrier is selected from the group consisting of $Al_2O_3$, $Ga_2O_3$, AlN, and GaN.

9. The device of claim 2, wherein the RE—TM alloy is magnetized in a direction perpendicular to a plane along which the first layer is oriented.

10. The device of claim 2, wherein the RE—TM alloy is magnetized in a direction parallel to a plane along which the first layer is oriented.

11. The device of claim 2, wherein the RE—TM alloy has a magnetic anisotropy of less than 50 Oersteds.

12. The device of claim 2, wherein the RE—TM alloy has a magnetic anisotropy of less than 10 Oersteds.

13. The device of claim 2, wherein the magnetic tunneling junction has a magnetoresistance whose absolute value is at least 40% at room temperature.

14. The device of claim 2, wherein the magnetic tunneling junction has a magnetoresistance whose absolute value is at least 75% at room temperature.

15. The device of claim 2, wherein the RE—TM alloy includes a CoGd alloy.

16. The device of claim 2, wherein the alloy includes a CoGd alloy having a Gd content of between 25 and 60 atomic percent.

17. The device of claim 2, wherein the alloy has a RE content of between 25 and 80 atomic percent.

18. The device of claim 2, wherein the thickness of the first layer is between 25 and 500 Å.

19. The device of claim 2, wherein the alloy has a composition near the compensation point, so that the alloy has, at room temperature, a magnetization that is less than 500 emu/cm$^3$ and a tunneling spin polarization whose magnitude is at least 50%.

20. The device of claim 2, further comprising:
a second tunnel barrier; and
a third layer that is positively spin-polarized and that includes magnetic material selected from the group of materials consisting of ferromagnetic materials and ferrimagnetic materials, wherein:
the second tunnel barrier is between the second layer and the third layer; and
the first layer, the first tunnel barrier, the second layer, the second tunnel barrier, and the third layer are configured to form a double tunnel junction device through which spin-polarized current can pass at room temperature.

21. The device of claim 2, wherein the RE and TM sub-network moments are antiferromagnetically coupled.

22. A device, comprising:
a tunnel barrier; and
a first layer that includes a rare earth element-transition metal (RE—TM) alloy in proximity with the tunnel barrier, wherein:
at least 25 atomic percent of the composition of the first layer is comprised of at least one rare earth element; and
the RE—TM alloy includes respective RE and TM sub-network moments such that the absolute magnitude of the RE sub-network moment is greater than the absolute magnitude of the TM sub-network moment, thereby enabling negatively spin-polarized current to pass between the tunnel barrier and the first layer at room temperature.

23. The device of claim 22, wherein said at least one rare earth element includes Gd.

24. The device of claim 22, wherein the RE—TM alloy includes at least one of Co—Gd, CoFe—Gd, Tb—Fe, Co—Tb, and CoFe—Tb.

25. The device of claim 22, wherein the tunnel barrier includes at least one of a MgO tunnel barrier and a Mg—ZnO tunnel barrier.

26. The device of claim 22, wherein the RE—TM alloy has a magnetic anisotropy of less than 20 Oersteds.

27. The device of claim 22, further comprising a second layer that includes magnetic material selected from the group of materials consisting of ferromagnetic materials and ferrimagnetic materials, wherein the second layer is in proximity with the first tunnel barrier, so that the device forms a magnetic tunnel junction;
wherein the magnetic tunnel junction is in a low resistance state when the first and second layers have respective magnetic moments that are aligned antiparallel, and is in a high resistance state when the respective magnetic moments are aligned parallel; and
wherein the magnetic tunnel junction has a tunneling magnetoresistance whose absolute magnitude is at least 20% at room temperature.

28. The device of claim 22, wherein the magnetic tunnel junction has a tunneling magnetoresistance whose absolute magnitude is at least 40% at room temperature.

29. A device, comprising:
a tunnel barrier; and
a layer comprising a rare earth element-transition metal (RE—TM) alloy, the alloy contacting the tunnel barrier, thereby enabling spin-polarized current to pass between the tunnel barrier and the layer, wherein the RE—TM alloy includes at least one element selected from the group consisting of Gd, Tb, Dy, Ho, Er, Tm, and Yb.

30. The device of claim 29, wherein positively spin-polarized current passes between the tunnel barrier and the layer.

31. The device of claim 29, wherein negatively spin-polarized current passes between the tunnel barrier and the layer.

32. The device of claim 2, wherein said at least one element includes Gd.

33. The device of claim 2, wherein said at least one element includes Tb.

34. The device of claim 2, wherein the first tunnel barrier and the first layer are in direct contact.

35. The device of claim 22, wherein said at least one rare earth element includes Tb.

36. The device of claim 22, wherein at least 35 atomic percent of the composition of the first layer is comprised of at least one rare earth element.

37. The device of claim 29, wherein at least 25 atomic percent of the composition of the layer is comprised of at least one rare earth element.

38. The device of claim 29, wherein at least 35 atomic percent of the composition of the layer is comprised of at least one rare earth element.

39. The device of claim 29, wherein said at least one element includes Gd.

40. The device of claim 29, wherein said at least one element includes Tb.

41. The device of claim 29, wherein the RE—TM alloy is magnetized in a direction oriented along a plane of the layer.

42. A device, comprising:
a tunnel barrier;
a first layer comprising a rare earth element-transition metal (RE—TM) alloy in proximity with the tunnel barrier, thereby enabling spin-polarized current to pass between the tunnel barrier and the first layer, wherein the RE—TM alloy is magnetized along a direction, and wherein the RE—TM alloy includes at least one element selected from the group consisting of Gd, Tb, Dy, Ho, Er, Tm, and Yb; and
a second layer that is between, and in contact with, the tunnel barrier and the RE—TM alloy, the second layer having a magnetization that is oriented along an axis aligned with said direction.

43. The device of claim 42, wherein the first layer and the second layer have respective magnetizations that are parallel to each other.

44. The device of claim 42, wherein the first layer and the second layer have respective magnetizations that are antiparallel to each other.

45. The device of claim 42, wherein at least 25 atomic percent of the composition of the first layer is comprised of at least one rare earth element.

46. The device of claim 42, wherein at least 35 atomic percent of the composition of the first layer is comprised of at least one rare earth element.

47. The device of claim 42, wherein said at least one element includes Gd.

48. The device of claim 42, wherein said at least one element includes Tb.

49. The device of claim 42, wherein the RE—TM alloy is magnetized in a direction oriented along a plane of the first layer.

* * * * *